United States Patent
Lear et al.

(10) Patent No.: US 11,515,282 B2
(45) Date of Patent: Nov. 29, 2022

(54) ELECTROMAGNETIC SHIELDS WITH BONDING WIRES FOR SUB-MODULES

(71) Applicant: Qorvo US, Inc., Greensboro, NC (US)

(72) Inventors: Kelly M. Lear, Longwood, FL (US); Jeffrey Miller, Allen, TX (US); Joseph Edward Geniac, Greensboro, NC (US); Rommel Quintero, High Point, NC (US)

(73) Assignee: Qorvo US, Inc., Greensboro, NC (US)

( * ) Notice: Subject to any disclaimer, the term of this patent is extended or adjusted under 35 U.S.C. 154(b) by 0 days.

(21) Appl. No.: 16/417,815

(22) Filed: May 21, 2019

(65) Prior Publication Data
US 2020/0373273 A1 Nov. 26, 2020

(51) Int. Cl.
*H01L 23/00* (2006.01)
*H01L 23/31* (2006.01)
(Continued)

(52) U.S. Cl.
CPC .......... *H01L 24/49* (2013.01); *H01L 23/3107* (2013.01); *H01L 24/97* (2013.01);
(Continued)

(58) Field of Classification Search
CPC ..... H01L 24/29; H01L 24/97; H01L 23/3107; H01L 2924/3025; H01L 2224/48091;
(Continued)

(56) References Cited

U.S. PATENT DOCUMENTS

| | | |
|---|---|---|
| 3,566,190 A | 2/1971 | Huebner et al. |
| 3,907,616 A | 9/1975 | Wiemer |

(Continued)

FOREIGN PATENT DOCUMENTS

| | | |
|---|---|---|
| CN | 1855451 A | 11/2006 |
| EP | 1458023 A2 | 9/2004 |

(Continued)

OTHER PUBLICATIONS

Notice of Allowance for U.S. Appl. No. 11/952,690, dated Aug. 30, 2010, 9 pages.
(Continued)

*Primary Examiner* — Allen L Parker
*Assistant Examiner* — Gustavo G Ramallo
(74) *Attorney, Agent, or Firm* — Withrow & Terranova, P.L.L.C.

(57) ABSTRACT

Electromagnetic shields for electronic devices, and particularly electromagnetic shields with bonding wires for sub-modules of electronic devices are disclosed. Electronic modules are disclosed that include multiple sub-modules arranged on a substrate with an electromagnetic shield arranged on or over the sub-modules. Bonding wires are disclosed that form one or more bonding wire walls along the substrate. The one or more bonding wire walls may be located between sub-modules of a module and about peripheral boundaries of the module. The electromagnetic shield may be electrically coupled to ground by way of the one or more bonding wire walls. Portions of the electromagnetic shield and the one or more bonding wire walls may form divider walls that are configured to reduce electromagnetic interference between the sub-modules or from external sources.

22 Claims, 9 Drawing Sheets

(51) Int. Cl.
  *H05K 1/02* (2006.01)
  *H05K 1/14* (2006.01)
  *H05K 3/40* (2006.01)
(52) U.S. Cl.
  CPC .......... *H05K 1/0218* (2013.01); *H05K 1/144* (2013.01); *H05K 3/4007* (2013.01); *H01L 2224/04042* (2013.01); *H01L 2224/48091* (2013.01); *H01L 2224/48229* (2013.01); *H01L 2924/14* (2013.01); *H01L 2924/1532* (2013.01); *H01L 2924/3025* (2013.01); *H05K 2201/10371* (2013.01)
(58) Field of Classification Search
  CPC .......... H01L 2224/04042; H05K 1/144; H05K 1/0218; H05K 2201/10371
  See application file for complete search history.

(56) References Cited

U.S. PATENT DOCUMENTS

| | | | |
|---|---|---|---|
| 3,907,617 A | 9/1975 | Zwernemann |
| 4,680,676 A | 7/1987 | Petratos et al. |
| 5,329,695 A | 7/1994 | Traskos et al. |
| 5,389,738 A | 2/1995 | Piosenka et al. |
| 5,406,630 A | 4/1995 | Piosenka et al. |
| 5,436,203 A | 7/1995 | Lin |
| 5,459,368 A | 10/1995 | Onishi et al. |
| 5,473,512 A | 12/1995 | Degani et al. |
| 5,592,391 A | 1/1997 | Muyshondt et al. |
| 5,623,293 A | 4/1997 | Aoki |
| 5,639,989 A | 6/1997 | Higgins, III |
| 5,646,828 A | 7/1997 | Degani et al. |
| 5,650,659 A | 7/1997 | Mostafazadeh et al. |
| 5,870,289 A | 2/1999 | Tokuda et al. |
| 5,977,626 A | 11/1999 | Wang et al. |
| 6,004,180 A | 12/1999 | Knall et al. |
| 6,011,698 A | 1/2000 | Buehler |
| 6,137,693 A | 10/2000 | Schwiebert et al. |
| 6,150,193 A | 11/2000 | Glenn |
| 6,163,454 A | 12/2000 | Strickler |
| 6,297,957 B1 | 10/2001 | Johnson et al. |
| 6,429,386 B2 | 8/2002 | DiBene, II et al. |
| 6,448,583 B1 | 9/2002 | Yoneda et al. |
| 6,448,793 B1 | 9/2002 | Barratt et al. |
| 6,466,416 B1 | 10/2002 | Honjo et al. |
| 6,515,870 B1 | 2/2003 | Skinner et al. |
| 6,534,859 B1 | 3/2003 | Shim et al. |
| 6,538,196 B1 | 3/2003 | MacDonald et al. |
| 6,590,152 B1 | 7/2003 | Horio et al. |
| 6,599,779 B2 | 7/2003 | Shim et al. |
| 6,613,660 B2 | 9/2003 | Kahlert et al. |
| 6,633,073 B2 | 10/2003 | Rezvani et al. |
| 6,657,592 B2 | 12/2003 | Dening et al. |
| 6,707,168 B1 | 3/2004 | Hoffman et al. |
| 6,717,485 B2 | 4/2004 | Kolb et al. |
| 6,791,795 B2 | 9/2004 | Ohtomo et al. |
| 6,807,731 B2 | 10/2004 | Brandenburg et al. |
| 6,825,560 B1 | 11/2004 | Walker et al. |
| 6,838,750 B2 | 1/2005 | Nuytkens et al. |
| 6,887,787 B2 | 5/2005 | Farnworth |
| 6,894,229 B1 | 5/2005 | Cheah |
| 6,900,383 B2 | 5/2005 | Babb et al. |
| 6,946,324 B1 | 9/2005 | McLellan et al. |
| 6,947,295 B2 | 9/2005 | Hsieh |
| 6,998,532 B2 | 2/2006 | Kawamoto et al. |
| 7,030,469 B2 | 4/2006 | Mahadevan et al. |
| 7,042,398 B2 | 5/2006 | Tang et al. |
| 7,087,461 B2 | 8/2006 | Park et al. |
| 7,087,462 B1 | 8/2006 | Park et al. |
| 7,109,410 B2 | 9/2006 | Arnold et al. |
| 7,109,817 B2 | 9/2006 | Kolb et al. |
| 7,125,744 B2 | 10/2006 | Takehara et al. |
| 7,148,574 B2 | 12/2006 | Lee et al. |
| 7,187,060 B2 | 3/2007 | Usui |
| 7,227,719 B2 | 6/2007 | Sasaki et al. |
| 7,259,041 B2 | 8/2007 | Stelzl et al. |
| 7,330,084 B2 | 2/2008 | Lee et al. |
| 7,342,303 B1 | 3/2008 | Berry et al. |
| 7,348,663 B1 | 3/2008 | Kirloskar et al. |
| 7,433,203 B1 | 10/2008 | Yi et al. |
| 7,443,693 B2 | 10/2008 | Arnold et al. |
| 7,445,968 B2 | 11/2008 | Harrison et al. |
| 7,451,539 B2 | 11/2008 | Morris et al. |
| 7,478,474 B2 | 1/2009 | Koga |
| 7,488,903 B2 | 2/2009 | Kawagishi et al. |
| 7,514,772 B2 | 4/2009 | Kobayashi et al. |
| 7,548,430 B1 | 6/2009 | Huemoeller et al. |
| 7,598,606 B2 | 10/2009 | Chow et al. |
| 7,633,170 B2 | 12/2009 | Yang et al. |
| 7,633,765 B2 | 12/2009 | Scanlan et al. |
| 7,635,918 B2 | 12/2009 | Yoshida |
| 7,636,245 B2 | 12/2009 | Clancy et al. |
| 7,643,311 B2 | 1/2010 | Coffy |
| 7,651,889 B2 | 1/2010 | Tang et al. |
| 7,665,201 B2 | 2/2010 | Sjoedin |
| 7,671,451 B2 | 3/2010 | Lee et al. |
| 7,700,411 B2 | 4/2010 | Yang et al. |
| 7,701,728 B2 | 4/2010 | Hatanaka et al. |
| 7,745,910 B1 | 6/2010 | Olson et al. |
| 7,772,046 B2 | 8/2010 | Pagaila et al. |
| 7,829,981 B2 | 11/2010 | Hsu |
| 7,902,643 B2 | 3/2011 | Tuttle |
| 7,902,644 B2 | 3/2011 | Huang et al. |
| 7,928,538 B2 | 4/2011 | Salzman |
| 7,989,928 B2 | 8/2011 | Liao et al. |
| 8,013,258 B2 | 9/2011 | Wu |
| 3,061,012 A1 | 11/2011 | Carey et al. |
| 8,053,872 B1 | 11/2011 | Swan et al. |
| 8,062,930 B1 | 11/2011 | Shah et al. |
| 8,071,431 B2 | 12/2011 | Hoang et al. |
| 8,084,300 B1 | 12/2011 | San Antonio et al. |
| 8,093,690 B2 | 1/2012 | Ko et al. |
| 8,093,691 B1 | 1/2012 | Fuentes et al. |
| 8,110,441 B2 | 2/2012 | Chandra et al. |
| 8,186,048 B2 | 5/2012 | Leahy et al. |
| 8,220,145 B2 | 7/2012 | Hiner et al. |
| 8,268,677 B1 | 9/2012 | Pagaila |
| 8,296,938 B2 | 10/2012 | Carey et al. |
| 8,296,941 B2 | 10/2012 | Hiner et al. |
| 8,349,659 B1 | 1/2013 | Swan et al. |
| 8,359,739 B2 | 1/2013 | Carey et al. |
| 8,373,264 B2 | 2/2013 | Welch et al. |
| 8,409,658 B2 | 4/2013 | Hiner et al. |
| 8,410,584 B2 | 4/2013 | An et al. |
| 8,434,220 B2 | 5/2013 | Rao et al. |
| 8,507,319 B2 | 8/2013 | Chow et al. |
| 8,552,539 B1 | 10/2013 | Foster |
| 8,614,899 B2 | 12/2013 | Madsen et al. |
| 8,664,774 B1 | 3/2014 | Mosinskis |
| 8,720,051 B2 | 5/2014 | Leahy et al. |
| 8,748,230 B2 | 6/2014 | Welch et al. |
| 8,835,226 B2 | 9/2014 | Morris et al. |
| 8,861,221 B2 | 10/2014 | Pagaila |
| 8,959,762 B2 | 2/2015 | Leahy et al. |
| 8,987,889 B2 | 3/2015 | Welch et al. |
| 9,048,020 B2 | 6/2015 | Calvillo Cortes et al. |
| 9,137,934 B2 | 9/2015 | Morris et al. |
| 9,450,547 B2 | 9/2016 | Szymanowski et al. |
| 9,589,927 B2 | 3/2017 | Szymanowski et al. |
| 9,627,230 B2 | 4/2017 | Carey et al. |
| 9,661,739 B2 | 5/2017 | Leahy et al. |
| 9,935,075 B2 | 4/2018 | Huang et al. |
| 9,978,691 B2 | 5/2018 | Kuo et al. |
| 2002/0036345 A1 | 3/2002 | Iseki et al. |
| 2002/0118529 A1 | 8/2002 | Babin et al. |
| 2002/0142516 A1 | 10/2002 | Light |
| 2003/0011049 A1 | 1/2003 | Nuytkens et al. |
| 2003/0048581 A1 | 3/2003 | Ohtomo et al. |
| 2003/0062541 A1 | 4/2003 | Warner |
| 2003/0090883 A1 | 5/2003 | Asahi et al. |
| 2003/0151122 A1 | 8/2003 | Davies |
| 2004/0063246 A1 | 4/2004 | Karnezos |
| 2004/0103509 A1 | 6/2004 | Bidard et al. |

(56) References Cited

U.S. PATENT DOCUMENTS

| | | |
|---|---|---|
| 2004/0104473 A1 | 6/2004 | Farnworth |
| 2004/0178500 A1 | 9/2004 | Usui |
| 2004/0209434 A1 | 10/2004 | Seaford et al. |
| 2004/0214023 A1 | 10/2004 | Park et al. |
| 2004/0222511 A1 | 11/2004 | Zhang |
| 2004/0232536 A1 | 11/2004 | Fukuzumi |
| 2004/0238934 A1 | 12/2004 | Warner et al. |
| 2005/0046001 A1 | 3/2005 | Warner |
| 2005/0153061 A1 | 7/2005 | Nuytkens et al. |
| 2006/0033184 A1 | 2/2006 | Park et al. |
| 2006/0113642 A1 | 6/2006 | Kajiki et al. |
| 2006/0119448 A1 | 6/2006 | Lee et al. |
| 2006/0151203 A1 | 7/2006 | Krueger et al. |
| 2006/0223577 A1 | 10/2006 | Ouzillou |
| 2006/0244131 A1 | 11/2006 | Kobayashi et al. |
| 2006/0266547 A1 | 11/2006 | Koga |
| 2006/0273467 A1 | 12/2006 | Brandenburg et al. |
| 2006/0273813 A1 | 12/2006 | Coffy |
| 2006/0274517 A1 | 12/2006 | Coffy |
| 2007/0030661 A1 | 2/2007 | Morris et al. |
| 2007/0042593 A1 | 2/2007 | Lee et al. |
| 2007/0045248 A1 | 3/2007 | Schein et al. |
| 2007/0058748 A1 | 3/2007 | Kim et al. |
| 2007/0062637 A1 | 3/2007 | Sjoedin |
| 2007/0155053 A1 | 7/2007 | Kamezos |
| 2007/0163802 A1 | 7/2007 | Monthei |
| 2007/0200210 A1 | 8/2007 | Zhao et al. |
| 2007/0221399 A1 | 9/2007 | Nishizawa et al. |
| 2007/0222697 A1 | 9/2007 | Caimi et al. |
| 2007/0290322 A1 | 12/2007 | Zhao et al. |
| 2008/0019112 A1 | 1/2008 | Hatanaka et al. |
| 2008/0054421 A1 | 3/2008 | Dimaano et al. |
| 2008/0067645 A1 | 3/2008 | Foong et al. |
| 2008/0108179 A1 | 5/2008 | Mistry et al. |
| 2008/0112151 A1 | 5/2008 | Thompson et al. |
| 2008/0139013 A1 | 6/2008 | Tomura et al. |
| 2008/0142938 A1 | 6/2008 | Chow et al. |
| 2008/0157316 A1 | 7/2008 | Yang |
| 2008/0210462 A1 | 9/2008 | Kawagishi et al. |
| 2008/0224306 A1 | 9/2008 | Yang |
| 2008/0308912 A1 | 12/2008 | Cha et al. |
| 2008/0317188 A1 | 12/2008 | Staszewski et al. |
| 2009/0000114 A1 | 1/2009 | Rao et al. |
| 2009/0000815 A1 | 1/2009 | Hiner et al. |
| 2009/0000816 A1 | 1/2009 | Hiner et al. |
| 2009/0002969 A1 | 1/2009 | Madsen et al. |
| 2009/0002970 A1 | 1/2009 | Leahy et al. |
| 2009/0002971 A1 | 1/2009 | Carey et al. |
| 2009/0002972 A1 | 1/2009 | Carey et al. |
| 2009/0009979 A1 | 1/2009 | Mori et al. |
| 2009/0016039 A1 | 1/2009 | Imamura |
| 2009/0025211 A1 | 1/2009 | Hiner et al. |
| 2009/0051011 A1 | 2/2009 | Usami |
| 2009/0066588 A1 | 3/2009 | Cheng et al. |
| 2009/0067149 A1 | 3/2009 | Bogursky et al. |
| 2009/0072357 A1 | 3/2009 | Tang et al. |
| 2009/0072364 A1 | 3/2009 | Punzalan et al. |
| 2009/0079041 A1 | 3/2009 | Huang et al. |
| 2009/0140402 A1 | 6/2009 | Ohtani |
| 2009/0227273 A1 | 9/2009 | McCune, Jr. |
| 2009/0233562 A1 | 9/2009 | Kim et al. |
| 2009/0270054 A1 | 10/2009 | Ridgers et al. |
| 2009/0302438 A1 | 12/2009 | Chauhan et al. |
| 2009/0315156 A1 | 12/2009 | Harper |
| 2010/0032815 A1 | 2/2010 | An et al. |
| 2010/0051343 A1 | 3/2010 | Lam |
| 2010/0052125 A1 | 3/2010 | Sasaki et al. |
| 2010/0123233 A1 | 5/2010 | Yoon et al. |
| 2010/0199492 A1 | 8/2010 | Hiner et al. |
| 2010/0207258 A1 | 8/2010 | Eun et al. |
| 2010/0224992 A1 | 9/2010 | McConnelee et al. |
| 2010/0279730 A1 | 11/2010 | Ortiz |
| 2011/0003435 A1 | 1/2011 | Tang et al. |
| 2011/0014880 A1 | 1/2011 | Nicolson et al. |
| 2011/0017263 A1 | 1/2011 | Gibson et al. |
| 2011/0038136 A1 | 2/2011 | Carey et al. |
| 2011/0084368 A1 | 4/2011 | Hoang et al. |
| 2011/0084378 A1 | 4/2011 | Welch et al. |
| 2011/0085314 A1 | 4/2011 | Franz |
| 2011/0114369 A1 | 5/2011 | Lee et al. |
| 2011/0182048 A1 | 7/2011 | Roethlingshoefer et al. |
| 2011/0225803 A1 | 9/2011 | Hiner et al. |
| 2011/0235282 A1 | 9/2011 | Leahy et al. |
| 2011/0298109 A1 | 12/2011 | Pagaila et al. |
| 2011/0298110 A1 | 12/2011 | Pagaila et al. |
| 2011/0298670 A1 | 12/2011 | Jung et al. |
| 2011/0316657 A1 | 12/2011 | Park et al. |
| 2012/0002377 A1 | 1/2012 | French et al. |
| 2012/0025356 A1* | 2/2012 | Liao ............... H01L 21/78 257/659 |
| 2012/0044653 A1 | 2/2012 | Morris et al. |
| 2012/0074538 A1 | 3/2012 | Tsai et al. |
| 2012/0075821 A1 | 3/2012 | Pagaila |
| 2012/0126378 A1 | 5/2012 | San Antonio et al. |
| 2012/0139640 A1 | 6/2012 | Calvillo Cortes et al. |
| 2012/0182706 A1 | 7/2012 | Siomkos et al. |
| 2012/0217048 A1 | 8/2012 | Leahy et al. |
| 2012/0217624 A1 | 8/2012 | Morris et al. |
| 2012/0218729 A1 | 8/2012 | Carey et al. |
| 2012/0270371 A1 | 10/2012 | DeBar et al. |
| 2012/0286415 A1* | 11/2012 | Sakai ............... H01L 21/78 257/734 |
| 2013/0324069 A1 | 12/2013 | Chen et al. |
| 2014/0077349 A1 | 3/2014 | Higgins, III |
| 2014/0097007 A1 | 4/2014 | Nagai et al. |
| 2014/0182920 A1 | 7/2014 | Yanagisawa et al. |
| 2014/0262442 A1 | 9/2014 | Nomura et al. |
| 2014/0268587 A1 | 9/2014 | Nomura et al. |
| 2014/0307394 A1 | 10/2014 | Lobianco et al. |
| 2014/0340859 A1 | 11/2014 | Morris et al. |
| 2014/0353807 A1 | 12/2014 | Welch |
| 2014/0355222 A1 | 12/2014 | Dang et al. |
| 2015/0091157 A9 | 4/2015 | Chi et al. |
| 2015/0124421 A1 | 5/2015 | Leahy et al. |
| 2015/0170986 A1 | 6/2015 | Szymanowski et al. |
| 2015/0296631 A1 | 10/2015 | Morris et al. |
| 2015/0348936 A1* | 12/2015 | Lin ............... H01L 24/19 257/659 |
| 2016/0087588 A1 | 3/2016 | Szymanowski et al. |
| 2016/0148882 A1 | 5/2016 | Kim et al. |
| 2016/0211222 A1 | 7/2016 | Kuo et al. |
| 2017/0117230 A1 | 4/2017 | Kumbhat et al. |
| 2017/0118877 A1 | 4/2017 | Kumbhat et al. |
| 2017/0127581 A1 | 5/2017 | Figueredo et al. |
| 2017/0133326 A1 | 5/2017 | Dang et al. |
| 2017/0194281 A1* | 7/2017 | DeLaCruz ............... H01L 24/17 |
| 2018/0033764 A1 | 2/2018 | Huang et al. |
| 2018/0130755 A1* | 5/2018 | Lee ............... H01L 23/552 |
| 2019/0371738 A1 | 12/2019 | Morris et al. |
| 2020/0203248 A1 | 6/2020 | Nair et al. |

FOREIGN PATENT DOCUMENTS

| | | |
|---|---|---|
| EP | 1715520 B1 | 10/2006 |
| EP | 1717857 A2 | 11/2006 |
| EP | 1764834 B1 | 3/2009 |
| JP | H11163583 A | 6/1999 |
| JP | 2004207352 A | 7/2004 |
| JP | 2005039007 A | 2/2005 |
| JP | 2005109306 A | 4/2005 |
| JP | 2006332255 A | 12/2006 |
| JP | 2007311396 A | 11/2007 |
| JP | 2011523120 A | 8/2011 |
| JP | 5254446 B2 | 8/2013 |
| KR | 20060113412 A | 11/2006 |
| TW | 201108360 A | 3/2011 |
| TW | 201142965 A | 12/2011 |
| WO | 0035085 A1 | 6/2000 |
| WO | 03058812 A1 | 7/2003 |
| WO | 2004019490 A1 | 3/2004 |
| WO | 2004060034 A1 | 7/2004 |
| WO | 2007060784 A1 | 5/2007 |
| WO | 2007132560 A1 | 11/2007 |
| WO | 2009099699 A1 | 8/2009 |

(56) References Cited

FOREIGN PATENT DOCUMENTS

| WO | 2009144960 A1 | 12/2009 |
| WO | 2010014103 A1 | 2/2010 |
| WO | 2010021262 A1 | 2/2010 |

OTHER PUBLICATIONS

Non-Final Office Action for U.S. Appl. No. 11/952,690, dated Mar. 25, 2010, 9 pages.
Non-Final Rejection for U.S. Appl. No. 12/913,364, dated Feb. 13, 2012, 6 pages.
Notice of Allowance for U.S. Appl. No. 12/913,364, dated Jun. 8, 2012, 8 pages.
Non-Final Office Action for U.S. Appl. No. 13/189,838, dated Mar. 14, 2014, 14 pages.
Final Office Action for U.S. Appl. No. 13/189,838, dated Jun. 19, 2014, 10 pages.
Advisory Action for U.S. Appl. No. 13/189,838, dated Aug. 28, 2014, 2 pages.
Non-Final Office Action for U.S. Appl. No. 13/189,838, dated Oct. 28, 2014, 11 pages.
Final Office Action for U.S. Appl. No. 13/189,838, dated Feb. 20, 2015, 13 pages.
Non-Final Office Action for U.S. Appl. No. 13/034,755, dated Aug. 15, 2013, 6 pages.
Final Office Action for U.S. Appl. No. 13/034,755, dated Jan. 31, 2014, 10 pages.
Advisory Action for U.S. Appl. No. 13/034,755, dated Mar. 4, 2014, 3 pages.
Notice of Allowance for U.S. Appl. No. 13/034,755, dated Oct. 17, 2014, 7 pages.
Non-Final Office Action for U.S. Appl. No. 13/034,787, dated Jan. 16, 2013, 9 pages.
Final Office Action for U.S. Appl. No. 13/034,787, dated Mar. 19, 2013, 9 pages.
Advisory Action for U.S. Appl. No. 13/034,787, dated May 17, 2013, 3 pages.
Non-Final Office Action for U.S. Appl. No. 13/034,787, dated Aug. 9, 2013, 9 pages.
Final Office Action for U.S. Appl. No. 13/034,787, dated Nov. 15, 2013, 12 pages.
Advisory Action for U.S. Appl. No. 13/034,787, dated Jan. 27, 2014, 4 pages.
Advisory Action for U.S. Appl. No. 13/034,787, dated Feb. 26, 2014, 4 pages.
Notice of Allowance for U.S. Appl. No. 13/034,787, dated May 1, 2014, 9 pages.
Corrected Notice of Allowability for U.S. Appl. No. 13/034,787, dated Jul. 29, 2014, 5 pages.
Non-Final Office Action for U.S. Appl. No. 12/797,381, dated Jan. 8, 2013, 20 pages.
Final Office Action for U.S. Appl. No. 12/797,381, dated May 16, 2013, 19 pages.
Advisory Action for U.S. Appl. No. 12/797,381, dated Jul. 17, 2013, 3 pages.
Examiner's Answer for U.S. Appl. No. 12/797,381, dated Dec. 31, 2013, 6 pages.
Final Office Action for U.S. Appl. No. 13/036,272, dated Oct. 20, 2014, 6 pages.
Advisory Action for U.S. Appl. No. 13/036,272, dated Jan. 8, 2015, 3 pages.
Author Unknown, "Cho-Shield Conductive Coatings," Chomerics—EMI Products, Copyright: 2001, 1 page, Retrieved from http://www.chomerics.com/products/choshield_coatings.htm.
Author Unknown, "Cho-Shield Conductive Coatings," Chomerics: A Division of Parker Hannifin Corporation, Dec. 8, 2000, 3 pages, Retrieved from: http://www.chomerics.com/products/choshield_coatings.htm.
Author Unknown, "Fractional-N RF Synthesizer with Modulator and Digital IF Filter (RF6001)," RF Micro Devices: Part of the Polaris Total Radio Solution, 2005, 2 pages.
Notice of Allowance for U.S. Appl. No. 13/189,838, dated May 4, 2015, 8 pages.
Notice of Allowance for U.S. Appl. No. 13/189,838, dated Jul. 30, 2015, 5 pages.
Non-Final Office Action for U.S. Appl. No. 13/036,272, dated Apr. 14, 2015, 7 pages.
Non-Final Office Action for U.S. Appl. No. 14/447,847, dated May 7, 2015, 7 pages.
Final Office Action for U.S. Appl. No. 14/447,847, dated Sep. 14, 2015, 8 pages.
Non-Final Office Action for U.S. Appl. No. 13/906,892, dated Aug. 10, 2015, 10 pages.
International Preliminary Report on Patentability and Written Opinion for International Patent Application No. PCT/JS2008/068153, dated Jan. 5, 2010, 6 pages.
Non-Final Office Action for U.S. Appl. No. 14/595,401, dated Mar. 28, 2016, 14 pages.
Examination Report for Indian Patent Application No. 8469/DELNP/2009, dated Apr. 11, 2017, 7 pages.
Final Office Action for U.S. Appl. No. 14/595,401, dated Oct. 6, 2016, 15 pages.
Notice of Allowance for U.S. Appl. No. 14/595,401, dated Jan. 6, 2017, 8 pages.
Non-Final Office Action for U.S. Appl. No. 14/750,384, dated Aug. 10, 2017, 9 pages.
Notice of Allowance for U.S. Appl. No. 14/750,384, dated Nov. 22, 2017, 8 pages.
Decision on Appeal for U.S. Appl. No. 12/797,381, dated Mar. 11, 2016, 6 pages.
Final Office Action for U.S. Appl. No. 13/036,272, dated Nov. 19, 2015, 9 pages.
Advisory Action for U.S. Appl. No. 13/036,272, dated Feb. 5, 2016, 3 pages.
Non-Final Office Action for U.S. Appl. No. 13/036,272, dated Apr. 8, 2016, 7 pages.
Notice of Allowance for U.S. Appl. No. 13/036,272, dated Sep. 30, 2016, 5 pages.
Final Office Action for U.S. Appl. No. 14/447,847, dated Dec. 11, 2015, 8 pages.
Hearing Notice for Indian Patent Application No. 8469/DELNP/2009, dated Dec. 26, 2019, 3 pages.
Non-Final Office Action for U.S. Appl. No. 16/390,761, dated Dec. 27, 2019, 9 pages.
Notice of Allowance for U.S. Appl. No. 16/390,761, dated Mar. 24, 2020, 7 pages.
Notice of Allowance for U.S. Appl. No. 14/447,847, dated Feb. 29, 2016, 7 pages.
Notice of Allowance for U.S. Appl. No. 14/447,847, dated Mar. 31, 2016, 7 pages.
Corrected Notice of Allowability for U.S. Appl. No. 14/447,847, dated Jul. 15, 2016, 4 pages.
Final Office Action for U.S. Appl. No. 13/906,892, dated Feb. 11, 2016, 10 pages.
Advisory Action for U.S. Appl. No. 13/906,892, dated Jun. 15, 2016, 2 pages.
Final Office Action for U.S. Appl. No. 13/906,892, dated Aug. 26, 2016, 11 pages.
Advisory Action for U.S. Appl. No. 13/906,892, dated Nov. 28, 2016, 3 pages.
Final Office Action for U.S. Appl. No. 13/906,892, dated Dec. 15, 2016, 11 pages.
Advisory Action for U.S. Appl. No. 13/906,892, dated Mar. 14, 2017, 3 pages.
Non-Final Office Action for U.S. Appl. No. 13/906,892, dated Apr. 3, 2017, 9 pages.
Notice of Allowance for U.S. Appl. No. 13/906,892, dated May 19, 2017, 9 pages.
International Search Report and Written Opinion for International Patent Application No. PCT/US2019/066721, dated Apr. 24, 2020, 16 pages.

(56) References Cited

OTHER PUBLICATIONS

Non-Final Office Action for U.S. Appl. No. 16/372,910, dated Mar. 30, 2020, 13 pages.
Notice of Allowance for U.S. Appl. No. 11/199,319, dated Oct. 2, 2008, 6 pages.
Non-Final Office Action for U.S. Appl. No. 11/435,913, dated May 21, 2010, 5 pages.
Final Office Action for U.S. Appl. No. 11/435,913, dated Nov. 17, 2009, 8 pages.
Non-Final Office Action for U.S. Appl. No. 11/435,913, dated Mar. 2, 2009, 8 pages.
Final Office Action for U.S. Appl. No. 11/435,913, dated Aug. 15, 2008, 8 pages.
Non-Final Office Action for U.S. Appl. No. 11/435,913, dated Jan. 7, 2008, 7 pages.
Non-Final Office Action for U.S. Appl. No. 11/768,014, dated Jan. 21, 2009, 9 pages.
Non-Final Office for U.S. Appl. No. 11/768,014, dated Mar. 25, 2010, 9 pages.
Non-Final Office for U.S. Appl. No. 11/768,014, dated Jul. 10, 2009, 7 pages.
Notice of Allowance for U.S. Appl. No. 13/187,814, dated Sep. 10, 2012, 8 pages.
Non-Final Office Action for U.S. Appl. No. 11/952,484, dated Jan. 8, 2010, 17 pages.
Final Office Action for U.S. Appl. No. 11/952,484, dated Oct. 5, 2010, 19 pages.
Non-Final Office Action for U.S. Appl. No. 11/952,484, dated Oct. 27, 2011, 22 pages.
Non-Final Office Action for U.S. Appl. No. 13/415,643, dated Jan. 3, 2013, 17 pages.
Quayle Action for U.S. Appl. No. 13/415,643, dated Jul. 11, 2013, 6 pages.
Notice of Allowance for U.S. Appl. No. 13/415,643, dated Aug. 15, 2013, 8 pages.
Non-Final Office Action for U.S. Appl. No. 11/952,513, dated May 10, 2011, 19 pages.
Final Office Action for U.S. Appl. No. 11/952,513, dated Oct. 26, 2011, 16 pages.
Notice of Allowance for U.S. Appl. No. 11/952,513, dated Mar. 6, 2012, 9 pages.
Non-Final Office Action for U.S. Appl. No. 13/117,284, dated Nov. 9, 2011, 12 pages.
Final Office Action for U.S. Appl. No. 13/117,284, dated Feb. 29, 2012, 8 pages.
Notice of Allowance for U.S. Appl. No. 13/117,284, dated May 1, 2012, 8 pages.
Non-Final Office Action for U.S. Appl. No. 11/952,545, dated Oct. 23, 2009, 12 pages.
Non-Final Office Action for U.S. Appl. No. 12/766,347, dated Jun. 29, 2012, 11 pages.
Notice of Allowance for U.S. Appl. No. 11/952,592, dated Aug. 6, 2012, 7 pages.
Non-Final Office Action for U.S. Appl. No. 11/952,592, dated Sep. 19, 2011, 9 pages.
Final Office Action for U.S. Appl. No. 11/952,592, dated Feb. 24, 2011, 9 pages.
Non-Final Office Action for U.S. Appl. No. 11/952,592, dated Dec. 15, 2010, 9 pages.
Non-Final Office Action for U.S. Appl. No. 11/952,592, dated Jul. 28, 2009, 7 pages.
Final Office Action for U.S. Appl. No. 11/952,592, dated Apr. 16, 2010, 8 pages.
Final Office Action for U.S. Appl. No. 11/952,592, dated Jan. 18, 2012, 10 pages.
Non-Final Office Action for U.S. Appl. No. 11/952,592, dated Jun. 12, 2012, 10 pages.
Notice of Allowance for U.S. Appl. No. 11/952,617, dated Jan. 8, 2013, 8 pages.
Notice of Allowance for U.S. Appl. No. 11/952,617, dated Jun. 4, 2012, 9 pages.
Final Office Action for U.S. Appl. No. 11/952,617, dated Feb. 16, 2012, 7 pages.
Non-Final Office Action for U.S. Appl. No. 11/952,617, dated Jul. 28, 2011, 9 pages.
Non-Final Office Action for U.S. Appl. No. 11/952,617, dated Sep. 26, 2008, 10 pages.
Final Office Action for U.S. Appl. No. 11/952,617, dated Nov. 20, 2009, 16 pages.
Non-Final Office Action for U.S. Appl. No. 11/952,634, dated Jun. 13, 2011, 7 pages.
Final Office Action for U.S. Appl. No. 11/952,634, dated Feb. 1, 2011, 7 pages.
Final Office Action for U.S. Appl. No. 11/952,634, dated Dec. 23, 2010, 8 pages.
Non-Final Office Action for U.S. Appl. No. 11/952,634, dated Jul. 21, 2010, 7 pages.
Notice of Allowance for U.S. Appl. No. 13/151,499, dated Dec. 19, 2013, 8 pages.
International Search Report for PCT/US2008/068153, dated Dec. 9, 2008, 3 pages.
Office Action for Chinese Patent Application No. 200880104171.1, dated Jun. 2, 2011, 20 pages.
Second Office Action for Chinese Patent Application No. 200880104171.1, dated Feb. 16, 2012, 8 pages.
Non-Final Office Action for U.S. Appl. No. 11/952,670, dated Jun. 22, 2011, 4 pages.
Non-Final Office Action for U.S. Appl. No. 11/952,670, dated May 27, 2010, 6 pages.
Notice of Allowance for U.S. Appl. No. 11/952,670, dated Oct. 21, 2009, 6 pages.
Notice of Allowance for U.S. Appl. No. 11/952,670, dated Aug. 24, 2012, 7 pages.
Non-Final Office Action for U.S. Appl. No. 16/372,910, dated Dec. 31, 2020, 13 pages.
Final Office Action for U.S. Appl. No. 16/390,761, dated Dec. 28, 2020, 8 pages.
Advisory Action for U.S. Appl. No. 16/390,761, dated Feb. 25, 2021, 3 pages.
Notice of Allowance for U.S. Appl. No. 16/893,941, dated Feb. 26, 2021, 7 pages.
Non-Final Office Action for U.S. Appl. No. 16/579,080, dated Dec. 10, 2020, 9 pages.
Final Office Action for U.S. Appl. No. 16/372,910, dated Aug. 13, 2020, 13 pages.
Advisory Action for U.S. Appl. No. 16/372,910, dated Oct. 27, 2020, 3 pages.
Non-Final Office Action for U.S. Appl. No. 16/390,761, dated Aug. 20, 2020, 9 pages.
Non-Final Office Action for U.S. Appl. No. 16/893,941, dated Sep. 23, 2020, 8 pages.
Notice of Allowance for U.S. Appl. No. 16/372,910, dated May 18, 2021, 8 pages.
Non-Final Office Action for U.S. Appl. No. 16/390,761, dated Apr. 15, 2021, 6 pages.
Notice of Allowance for U.S. Appl. No. 16/579,080, dated Apr. 22, 2021, 7 pages.
International Preliminary Report on Patentability for International Patent Application No. PCT/US2019/066721, dated Jul. 1, 2021, 10 pages.
Notice of Allowance for U.S. Appl. No. 16/390,761, dated Aug. 27, 2021, 7 pages.
Examination Report for European Patent Application No. 19842448.3, dated Dec. 2, 2021, 7 pages.
Examination Report for European Patent Application No. 19842448.3, dated Jun. 7, 2022, 6 pages.

* cited by examiner

ELECTROMAGNETIC SHIELDS WITH
BONDING WIRES FOR SUB-MODULES

FIELD OF THE DISCLOSURE

The present disclosure relates to electromagnetic shields for electronic devices, and particularly to electromagnetic shields with bonding wires for sub-modules of electronic devices.

BACKGROUND

Electronic components have become ubiquitous in modern society. The electronics industry routinely announces accelerated clocking speeds and smaller integrated circuit modules. While the benefits of these devices are myriad, smaller and faster electronic devices create problems. In particular, high clock speeds inherently require fast transitions between signal levels. Fast transitions between signal levels create electromagnetic emissions throughout the electromagnetic spectrum. Such emissions are regulated by the Federal Communications Commission (FCC) and other regulatory agencies. Furthermore, fast speed transitions inherently mean higher frequencies. Higher frequencies mean shorter wavelengths, requiring shorter conductive elements to act as antennas to broadcast these electromagnetic emissions. The electromagnetic emissions radiate from a source and may impinge upon other electronic components. If the signal strength of the emission at the impinged upon electronic component is high enough, the emission may interfere with the operation of the impinged upon electronic component. This phenomenon is sometimes called electromagnetic interference (EMI) or crosstalk. Dealing with EMI and crosstalk is sometimes referred to as electromagnetic compatibility (EMC). Other components, such as transceiver modules, inherently have many radiating elements that raise EMI concerns. Thus, even electronic modules that do not have high clock speeds may need to address EMI issues.

One way to reduce EMI to comply with FCC regulations is to electromagnetically shield the electronic modules. Typically a shield is formed from a grounded conductive material that surrounds an electronic module. When electromagnetic emissions from the electronic module strike the interior surface of the conductive material, the electromagnetic emissions are electrically shorted through the grounded conductive material, thereby reducing emissions. Likewise, when emissions from another radiating element strike the exterior surface of the conductive material, a similar electrical short occurs, and the electronic module experiences reduced EMI from other electronic modules.

However, as electronic modules continue to become smaller from miniaturization, creating effective shields that do not materially add to the size of modules becomes more difficult. Thus, there is a need for an electromagnetic shield that is inexpensive to manufacture on a large scale, does not substantially increase the size of electronic modules, and effectively deals with EMI concerns.

SUMMARY

The present disclosure relates to electromagnetic shields for electronic devices, and particularly to electromagnetic shields with bonding wires for sub-modules of electronic devices. Electronic modules as disclosed herein may include multiple sub-modules arranged on a substrate with an electromagnetic shield arranged on or over the sub-modules. Bonding wires are disclosed that form one or more bonding wire walls along the substrate. The one or more bonding wire walls may be located between sub-modules of a module and about peripheral boundaries of the module. In certain embodiments, the electromagnetic shield is electrically coupled to ground by way of the one or more bonding wire walls. Portions of the electromagnetic shield and the one or more bonding wire walls may form divider walls that are configured to reduce electromagnetic interference (EMI) between the sub-modules or from external sources.

In one aspect, an electronic module comprises: a substrate; a first sub-module and a second sub-module arranged on a mounting surface of the substrate; a first plurality of bonding wires on the substrate that form a first bonding wire wall arranged between the first sub-module and the second sub-module; and an electromagnetic shield arranged on the first sub-module and the second sub-module, and a portion of the electromagnetic shield extends toward the substrate between the first sub-module and the second sub-module; wherein the first bonding wire wall and the portion of the electromagnetic shield that extend towards the substrate between the first sub-module and the second sub-module form a divider wall that reduces EMI between the first sub-module and the second sub-module. The electronic module may further comprise a second bonding wire wall that is arranged between the first sub-module and the second sub-module and adjacent to the first bonding wire wall, the second bonding wire wall formed from a second plurality of bonding wires. In certain embodiments, the first bonding wire wall is arranged with a parallel alignment to the second bonding wire wall. In certain embodiments, the first plurality of boding wires of the first bonding wire wall are arranged with a staggered alignment to the second plurality of boding wires of the second bonding wire wall. In certain embodiments, the first bonding wire wall is arranged with a non-linear alignment to the second bonding wire wall. In certain embodiments, the electromagnetic shield is electrically coupled to ground by way of the first bonding wire wall. The electronic module may further comprise an overmold body that is continuous across the first sub-module and the second sub-module. In certain embodiments, the first bonding wire wall is at least partially embedded in the overmold body. In certain embodiments, the portion of the electromagnetic shield that extends towards the substrate is arranged in an opening formed in the overmold body. The electronic module may further comprise a fill material arranged in the opening. In certain embodiments, the portion of the electromagnetic shield that extends toward the substrate is arranged in a plurality of openings formed in the overmold body.

In another aspect, an electronic module comprises: a substrate; a first sub-module and a second sub-module arranged on a mounting surface of the substrate; a first plurality of bonding wires on the substrate that form a first bonding wire wall arranged between the first sub-module and the second sub-module; a second plurality of bonding wires on the substrate that form a second bonding wire wall arranged about a peripheral boundary of the module; and an electromagnetic shield arranged on the first sub-module and the second sub-module, wherein the electromagnetic shield is electrically coupled to the first bonding wire wall and the second bonding wire wall. The electronic module may further comprise an overmold body that is continuous across the first sub-module and the second sub-module. In certain embodiments, the first bonding wire wall is at least partially embedded in the overmold body. In certain embodiments, the portion of the electromagnetic shield that extends towards the substrate is arranged in an opening formed in the overmold body. In certain embodiments, a height of the first bonding wire wall above the substrate is different that a height of the second bonding wire wall above the substrate. In certain embodiments, the electromagnetic shield is electrically coupled to ground by way of the first bonding wire wall and the second bonding wire wall.

In another aspect, an electronic module comprises: a substrate; a first sub-module and a second sub-module arranged on a mounting surface of the substrate; a first plurality of bonding wires on the substrate that form a first bonding wire wall, the first bonding wire wall forming a first height above the substrate; a second plurality of bonding wires on the substrate that form a second bonding wire wall, the second bonding wire wall forming a second height above the substrate that is less than the first height; and an electromagnetic shield arranged on the first sub-module and the second sub-module, wherein the electromagnetic shield is electrically coupled to the first bonding wire wall and the second bonding wire wall. In certain embodiments, the first bonding wire wall and the second bonding wire wall are arranged between the first sub-module and the second sub-module. In certain embodiments, the first bonding wire wall is arranged between the first sub-module and the second sub-module, and the second bonding wire wall is arranged about a peripheral boundary of the module. In certain embodiments, the second bonding wire wall is arranged between the first sub-module and the second sub-module, and the first bonding wire wall is arranged about a peripheral boundary of the module. In certain embodiments, the electromagnetic shield is electrically coupled to ground by way of the first bonding wire wall and the second bonding wire wall.

In another aspect, any of the foregoing aspects, and/or various separate aspects and features as described herein, may be combined for additional advantage. Any of the various features and elements as disclosed herein may be combined with one or more other disclosed features and elements unless indicated to the contrary herein.

Those skilled in the art will appreciate the scope of the present disclosure and realize additional aspects thereof after reading the following detailed description of the preferred embodiments in association with the accompanying drawing figures.

BRIEF DESCRIPTION OF THE DRAWING FIGURES

The accompanying drawing figures incorporated in and forming a part of this specification illustrate several aspects of the disclosure, and together with the description serve to explain the principles of the disclosure.

DETAILED DESCRIPTION

Figure 1A:
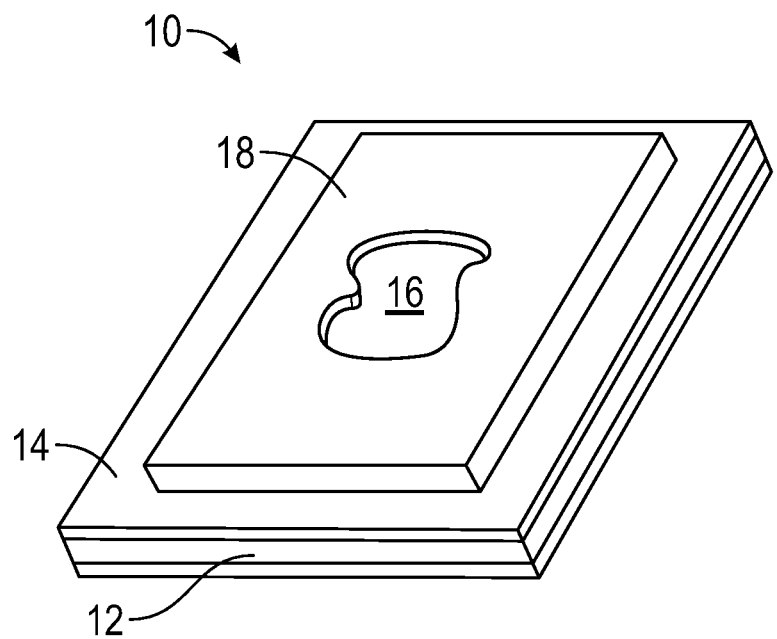
FIG. 1A illustrates a representative module having one sub-module, which is covered by an overmold body according to embodiments disclosed herein.

The embodiments set forth below represent the necessary information to enable those skilled in the art to practice the embodiments and illustrate the best mode of practicing the embodiments. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present disclosure. As used herein, the term "and/or" includes any and all combinations of one or more of the associated listed items.

It will be understood that when an element such as a layer, region, or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. Likewise, it will be understood that when an element such as a layer, region, or substrate is referred to as being "over" or extending "over" another element, it can be directly over or extend directly over the other element or intervening elements may also be present. In contrast, when an element is referred to as being "directly over" or extending "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "vertical" may be used herein to describe a relationship of one element, layer, or region to another element, layer, or region as illustrated in the Figures. It will be understood that these terms and those discussed above are intended to encompass different orientations of the device in addition to the orientation depicted in the Figures.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises," "comprising," "includes," and/or "including" when used herein specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms used herein should be interpreted as having a meaning that is consistent with their meaning in the context of this specification and the relevant art and will not be interpreted in an idealized or overly formal sense unless expressly so defined herein.

The present disclosure relates to electromagnetic shields for electronic devices, and particularly to electromagnetic shields with bonding wires for sub-modules of electronic devices. Electronic modules as disclosed herein may include multiple sub-modules arranged on a substrate with an electromagnetic shield arranged on or over the sub-modules. Bonding wires are disclosed that form one or more bonding wire walls along the substrate. The one or more bonding wire walls may be located between sub-modules of a module and about peripheral boundaries of the module. In certain embodiments, the electromagnetic shield is electrically coupled to ground by way of the one or more bonding wire walls. Portions of the electromagnetic shield and the one or more bonding wire walls may form divider walls that are configured to reduce electromagnetic interference (EMI) between the sub-modules or from external sources.

The present disclosure may be used to form one or more electromagnetic shields for corresponding component areas of a given electronic module. In certain embodiments, a meta-module having circuitry for two or more modules is formed on a substrate structure, which may include a laminated substrate structure. As such, the circuitry for different modules is initially formed on the single meta-module. Each module will have one or more component areas in which the circuitry is formed. A metallic structure is formed on or in the substrate for each component area to be shielded on the substrate. The metallic structure may be formed from traces, vias, metallic layers, metallic components, plating materials, or the like, as well as any combination thereof. In one embodiment, each metallic structure extends about all or a portion of the periphery of each of the component areas to be shielded. A single body, such as an overmold body, is then formed over all of the modules on the meta-module. After the body is formed, at least a portion of the metallic structure for each component area to be shielded is exposed through the body by a cutting, drilling, or like operation. Next, an electromagnetic shield material is applied to an exterior surface of the body of each of the component areas to be shielded and in contact with the exposed portion of the metallic structures. The modules are then singulated from each other to form separate modules, each of which having one or more integrally shielded component areas.

In certain embodiments, the electromagnetic shield material is provided using an electroless plating process, which deposits a conductive seed layer on the overmold body and in contact with the exposed portions of the metallic structures. Then, an electrolytic plating process is used to deposit a second conductive layer onto the conductive seed layer. A final layer of a metallic material, such as nickel (Ni), is then deposited on top of the second conductive layer through an electrolytic plating process. In another embodiment, the electromagnetic shield material is provided by applying a conductive epoxy or paint to the body and in contact with the exposed portions of the metallic structures. In other embodiments, the electromagnetic shield material may be provided by metallized thin film-based processes, such as, for example physical vapor deposition, sputtering, evaporation, chemical vapor deposition, and/or atomic layer deposition, among others. In these embodiments, the conductive layers create an integrated electromagnetic shield for one or more component areas of a module to reduce EMI.

For the following description, the preferred embodiments of the present disclosure are described. The scope of the disclosure and the claims that follow shall not be limited to these preferred embodiments. For example, the metallic structure in the preferred embodiments is formed in whole or in part from a metallic layer grid that resides on or in the surface of the substrate. Further, the metallic structure resides along all or a portion of the periphery of one or more component areas. These embodiments lend themselves to efficient processing; however, those skilled in the art will recognize that the metallic structure to which the integrated electromagnetic shield is connected need not reside along the periphery of the component area, or be part of a metallic layer grid. Importantly, the metallic structure may take virtually any form or shape, and may reside on or in the top surface of the substrate. The metallic structure may merely be a single point along the top surface of the module, or a continuous or segmented structure that extends along all or a portion of the one or more component areas to be shielded. Accordingly, the metallic layer grid used in the following embodiments to provide a metallic structure is merely provided to illustrate the preferred embodiments, and as such, shall not limit what constitutes a metallic structure or how a metallic structure is formed according to the present disclosure.

Figure 1B:
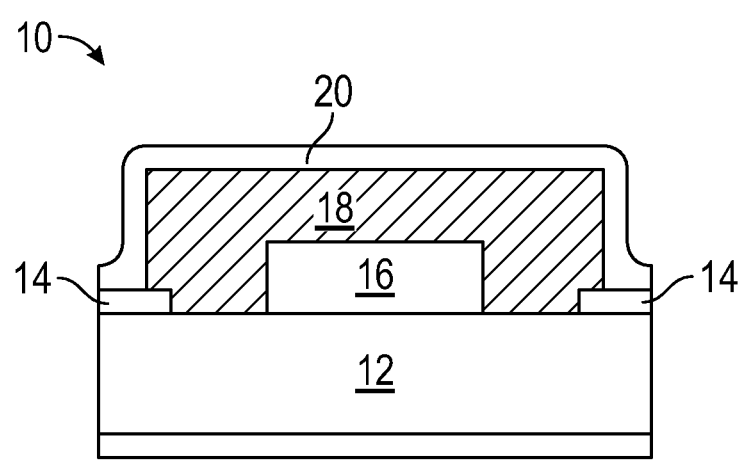
FIG. 1B illustrates a cross-section of the module of FIG. 1A in which an integrated electromagnetic shield is provided according to embodiments disclosed herein.

A module 10 is illustrated in FIG. 1A and FIG. 1B according to certain embodiments of the present disclosure. The module 10 has a substrate 12, which may include a laminate structure that comprises a metallic structure formed from a metallic layer grid 14 on or in a top surface of the substrate 12. In certain embodiments, the substrate 12 may comprise an epoxy laminate, such as FR-4 and the like. The substrate 12 may also be formed from other materials including ceramics and/or alumina. As indicated above, any metallic structure may be used; however, the preferred embodiment uses a portion of the metallic layer grid 14 to form a peripheral metallic structure. The metallic layer grid 14 may comprise any number of conductive materials, including one or more of gold (Au), silver (Ag), copper (Cu), and alloys thereof. Only one section of the metallic layer grid 14 is depicted in these figures and the peripheral metallic structure is not separately labeled, as it is formed from the metallic layer grid 14. The illustrated module 10 has a single component area 16 that lies within the peripheral metallic structure and in which circuitry for the module 10 is formed. The component area 16 may include one or more electronic components of various types depending on the application. For example, the electronic components may include an electronic circuit built on its own semiconductor substrate, such as a processor, volatile memory, non-volatile memory, a radio frequency (RF) circuit, or a micro-mechanical system (MEMS) device. In certain embodiments, the electronic components may include one or more electrical devices such as filters, capacitors, inductors, resistors, amplifiers, low-noise amplifiers (LNA), switching devices, transmit/receive modules, or electronic circuits having combinations thereof. A body, such as an overmold body 18 or overmold material, resides over the substrate 12 and encompasses the component area 16. The overmold body 18 may comprise one or more insulating or dielectric materials. In this regard, the overmold body 18 may be configured to provide encapsulation and electrical isolation for the electronic components that are mounted to the component area 16 of the substrate 12. In certain embodiments, exposed surfaces of the overmold bodies 18 may be cleaned, such as by a plasma cleaning process, to remove wax or other organic compounds and materials that remain on the surface of each overmold body 18. The plasma cleaning process subjects the surface of each overmold body 18 to a reactive process gas, such as argon (Ar), oxygen (O), nitrogen (N), hydrogen (H), carbon tetrafluoride ($CF_4$), sulfur hexafluoride ($SF_6$), nitrogen tri-fluoride ($NF_3$), or the like, which effectively etches away contaminants on the exposed surface of each overmold body 18. In essence, the contaminants are vaporized, burned, or otherwise removed from the exposed surface of the overmold body 18 when exposed to the process gas. In certain embodiments, the cleaned surface of each overmold body 18 may be roughened through an abrasion process, a desmear technique, or like process. In one embodiment, a chemical roughening process is provided. It should be appreciated that a mask (not shown) may be positioned on the underside of the substrate 12 so that the processes described in the steps below do not interfere with any electrical contacts that may be present on the bottom side of the substrate 12. The mask helps prevent liquids and gases from reaching these electrical contacts, which may act as input/output contacts for one or more components of the component area 16. Alternatively, a seal structure may be employed.

As depicted in FIG. 1B, an electromagnetic shield 20 is integrally formed over the overmold body 18 and in contact with exposed portions of the peripheral metallic structure of the metallic layer grid 14 to provide shielding from electromagnetic emissions. In certain embodiments, the peripheral metallic structure of the metallic layer grid 14 is coupled to ground and accordingly, the electromagnetic shield 20 is electrically grounded. In this manner, electromagnetic emissions that strike the electromagnetic shield 20 are electrically shorted to ground, thereby reducing EMI. The electromagnetic shield 20 may comprise a single layer or a plurality of layers. In certain embodiments, the electromagnetic shield 20 may comprise a first layer comprising a seed layer followed by one or more additional layers. For example, the seed layer may comprise a conductive material such as Cu, aluminum (Al), Ag, Au, or combinations thereof deposited by electroless plating or the like. A second layer may be subsequently formed on the seed layer comprising a metal such as Cu, Al, Ag, Au, or combinations thereof deposited by electrolytic plating or the like, followed by a third layer formed on the second layer, wherein the third layer comprises a less conductive material, such as Ni or other metals, than the first or second layers. The third layer may also be formed by electrolytic plating. The third layer may be provided to protect the first or second layers from tarnishing, corrosion, or other environmental effects. Likewise, the third layer may contribute to shielding by absorbing some electromagnetic radiation. In an exemplary embodiment, the electromagnetic shield 20 may be formed with an approximate thickness in a range from about 10 microns (μm) to about 50 μm. Greater or lesser thicknesses may also be generated. For example, in certain embodiments, the thickness of the electromagnetic shield 20 may be reduced to a range from about 5 μm to about 10 μm. In certain embodiments, the electromagnetic shield 20 may be referred to as a microshield.

Figure 2A:
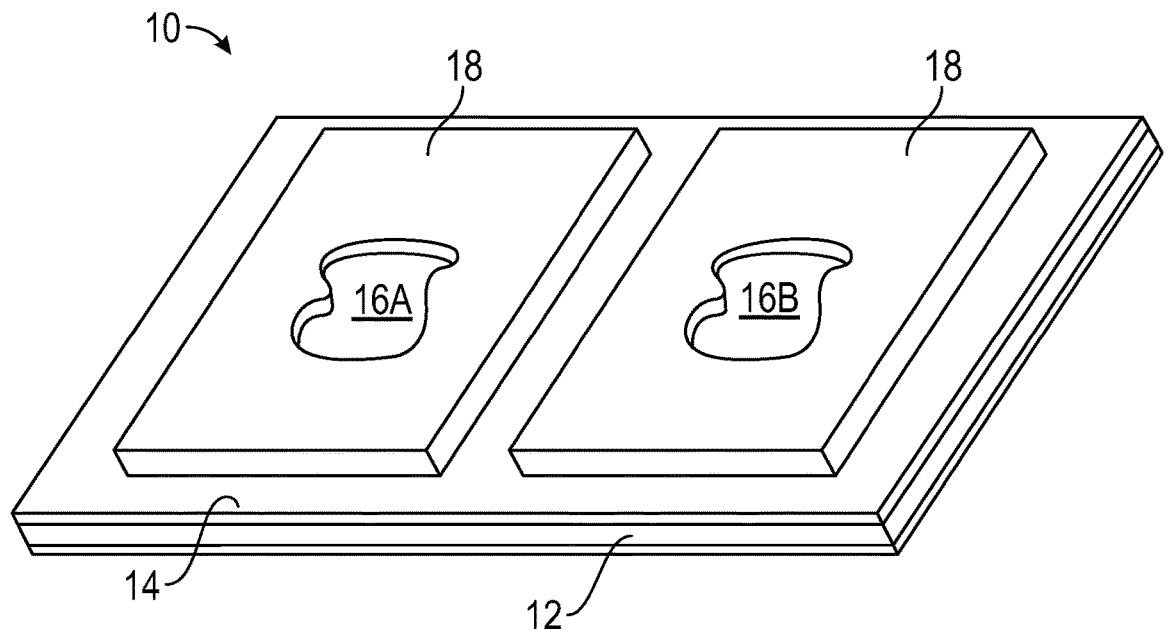
FIG. 2A illustrates a module having two sub-modules, which are covered by an overmold body according to embodiments disclosed herein.
Figure 2B:
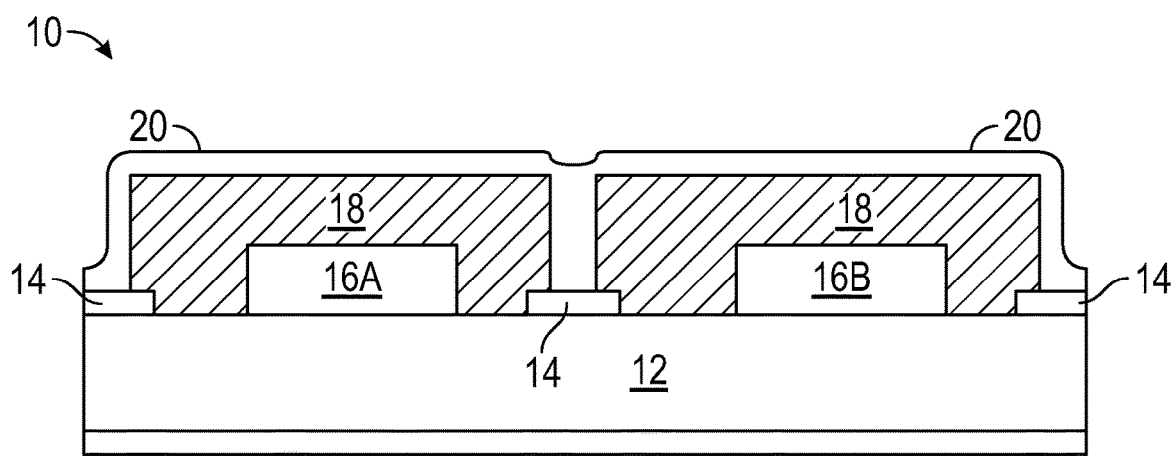
FIG. 2B illustrates a cross-section of the module of FIG. 2A in which an integrated electromagnetic shield is provided according to embodiments disclosed herein.

A given module 10 may include any number of component areas 16 where one or more of the component areas 16 have a corresponding electromagnetic shield 20. As illustrated in FIGS. 2A and 2B, two component areas 16A and 16B are positioned in the metallic layer grid 14 such that a peripheral metallic structure is provided for each of the component areas 16A and 16B. The two component areas 16A and 16B may be configured as two sub-modules within the module 10. In certain instances, the peripheral metallic structures for the adjacent component areas 16A and 16B may share a common section of the metallic layer grid 14. The illustrated module 10 has the two component areas 16A and 16B, which lie within corresponding peripheral metallic structures and in which circuitry (not illustrated) for the module 10 is formed. Overmold bodies 18 reside over the substrate 12 and encompass the respective component areas 16A and 16B. As depicted in FIG. 2B, one or more electromagnetic shields 20 are integrally formed over the overmold bodies 18 and in contact with exposed portions of the respective peripheral metallic structures of the metallic layer grid 14. In particular, the one or more electromagnetic shields 20 encompass both of the component areas 16A and 16B and further extend between the component areas 16A and 16B. A portion of the one or more electromagnetic shields 20 that is arranged between the component areas 16A and 16B may be referred to as an electromagnetic shield divider wall. In the manner, EMI from outside sources and EMI between the component areas 16A and 16B may be reduced. Although the component areas 16A and 16B of the module 10 are illustrated as being adjacent one another, they may also be substantially separated from one another. In this manner, the module 10 is configured to include multiple sub-modules, each of which includes one of the component areas 16A or 16B as well as the corresponding overmold body 18 and the corresponding electromagnetic shield 20 or a portion of the electromagnetic shield 20. During fabrication, a continuous overmold material may be blanket deposited over the two component areas 16A and 16B. A selective removal process may then be applied to the continuous overmold material to form the overmold bodies 18. The selective removal process may include at least one of cutting, drilling, etching, grinding, or the like to expose portions of the metallic layer grid 14 that are coupled to ground. Accordingly, the electromagnetic shield 20 that is subsequently deposited is electrically grounded by way of the previously exposed portions of the metallic layer grid 14. During the selective removal process, damage to the metallic layer grid 14 or the substrate 12 may occur due to exposure to the cutting, drilling, etching, or grinding.

As disclosed herein, improved EMI shielding between sub-modules may be provided with certain arrangements of divider walls that are provided between sub-modules. In certain embodiments, a portion of a divider wall may be formed with material from an electromagnetic shield that is formed over the sub-modules and another portion of the divider wall may include a bonding wire wall, which may also be referred to as a wire bond wall. The bonding wire wall may be formed between sub-modules on a substrate before application of an overmold material. In this manner, the bonding wire wall may be at least partially embedded within the overmold material. In certain embodiments, a portion of the overmold material that is registered with the bonding wire wall is selectively removed to expose portions of the bonding wire wall, such that the electromagnetic shield that is subsequently deposited may be electrically coupled to the bonding wire wall. In this manner, the selective removal process is halted before portions of the substrate or metallization on the substrate are exposed, thereby providing protection for the substrate and the metallization.

Figure 3A:
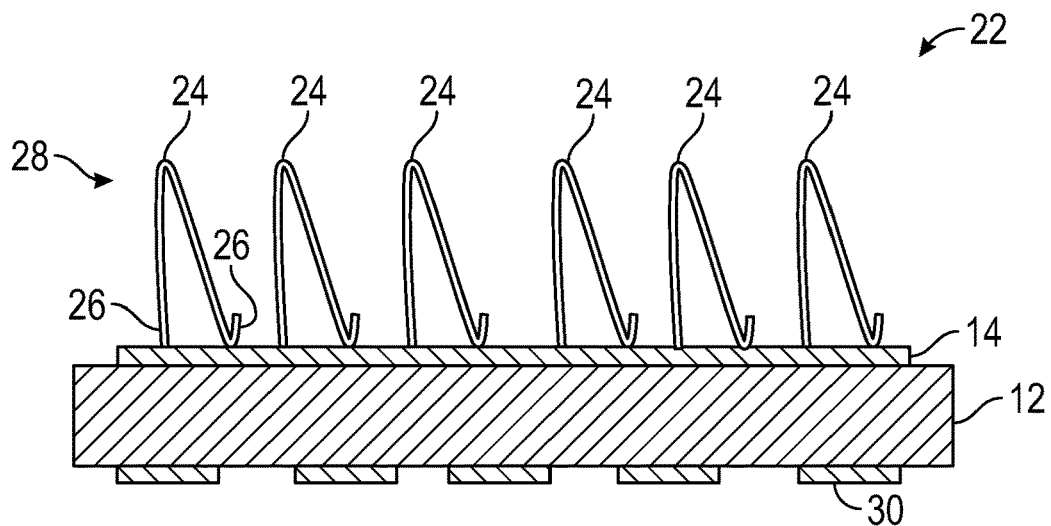
FIG. 3A is a cross-sectional view of an exemplary module that includes bonding wires that form a bonding wire wall according to embodiments disclosed herein.

FIG. 3A is a cross-sectional view of an exemplary module 22 that includes bonding wires 24 that form a bonding wire wall 28 according to embodiments disclosed herein. As illustrated, the bonding wires 24 are arranged on the substrate 12 and are bonded or otherwise electrically coupled to portions of the metallic layer grid 14 for electrical grounding. The bonding wires 24 may comprise any number of conductive materials, including one or more of palladium (Pd) coated Cu, Cu, Au, Ag, Al, and alloys thereof. The bonding wires 24 may be between 0.6 mil and 2.0 mil diameter and may include wire loops whose ends 26 are bonded to the metallic layer grid 14 through an appropriate technique, such as ultrasonic bonding (e.g., ball bonding, wedge bonding), compliant bonding, soldering, combinations of these techniques, and the like. The ends 26 of the bonding wires 24 may be generally separated from one another in certain embodiments. In an exemplary aspect, the bonding wires 24 may span a distance in a range from 350 μm to 550 μm, and the ends 26 of the bonding wires 24 may be separated by at least 80 μm. By forming a bonding wire wall 28 of electrically grounded bonding wires 24, the bonding wire wall 28 is configured to reduce EMI between sub-modules or electrical components that are arranged on opposing sides of the bonding wire wall 28. The substrate 12 may additionally include one or more module contacts 30.

Figure 3B:
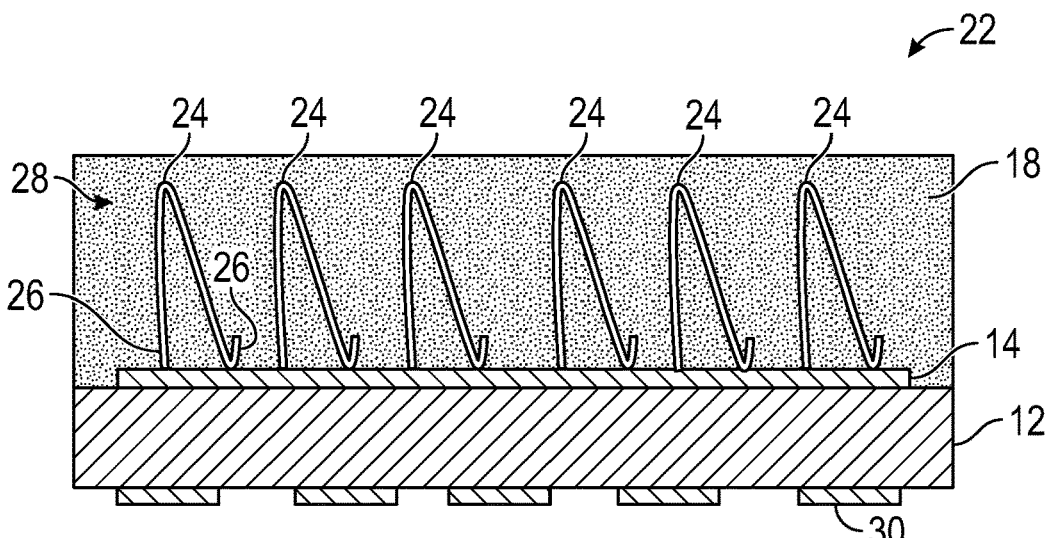
FIG. 3B is a cross-sectional view of the module of FIG. 3A, after an overmold body has been formed.

FIG. 3B is a cross-sectional view of the module 22 of FIG. 3A, after the overmold body 18 has been formed. The overmold body 18 is applied over the substrate 12 (e.g., over a top face of the substrate 12) to encapsulate each electronic component on the surface of the substrate 12 and the bonding wire wall 28. The overmold body 18 may be an organic epoxy resin or similar material deposited at a thickness of 350 μm or greater. The overmold body 18 may be applied by various procedures, such as sheet molding, overmolding, compression molding, transfer molding, dam fill encapsulation, or screen print encapsulation. In an exemplary aspect, the overmold body 18 fills any space below the bonding wires 24 and a curing process hardens the overmold body 18, thereby providing mechanical stability and encapsulation for the bonding wire wall 28.

Figure 3C:
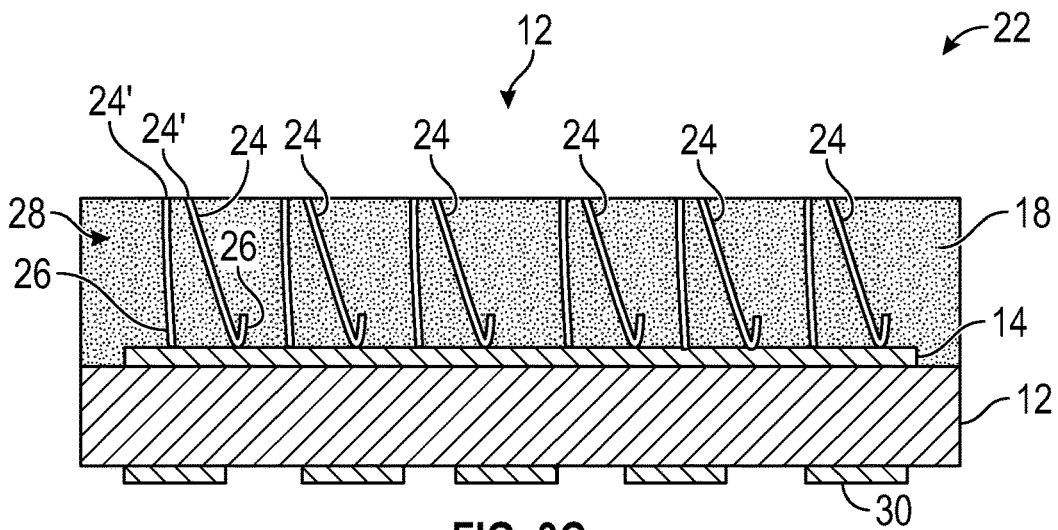
FIG. 3C is a cross-sectional view of the module of FIG. 3B, after a removal process has been applied to a portion of the overmold body.

FIG. 3C is a cross-sectional view of the module 22 of FIG. 3B, after a removal process has been applied to a portion of the overmold body 18. As illustrated, a portion of the overmold body 18 is removed to form exposed surfaces 24' of the bonding wires 24. The exposed surfaces 24' are formed through an appropriate technique, such as by cutting, drilling, etching, grinding (e.g., strip level grinding), or the like on portions of a top surface of the overmold body 18. By way of a non-limiting example, if the overmold body 18 is initially formed with a thickness of 350 μm or greater, the removal process may reduce a thickness of at least a portion of the overmold body 18 to a thickness of 320 μm.

In certain embodiments, the removal process also removes a portion of the bonding wires 24, thereby forming the exposed surfaces 24' of the bonding wires 24 at the top surface of the overmold body 18.

Figure 3D:
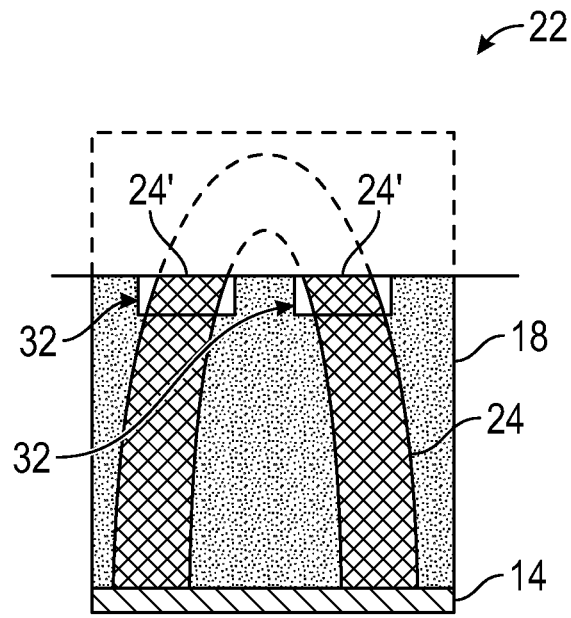
FIG. 3D is a cross-sectional view of a portion of the module of FIG. 3C, illustrating a cavity formed around bonding wires according to embodiments disclosed herein.

FIG. 3D is a cross-sectional view of a portion of the module 22 of FIG. 3C, illustrating a cavity 32 formed around the bonding wires 24 in certain embodiments. In an exemplary aspect, the cavity 32 is formed by laser ablating portions of the overmold body 18 about each of the exposed surfaces 24' of the bonding wires 24. Other techniques may also be applied, such as mechanical removal (e.g., water jets, grinding), ion milling, chemical removal, and the like. The cavity 32 may form a width in a range including 1 μm to 20 μm about each bonding wire 24, and may form a depth in a range including 1 μm to 10 μm. The cavity 32 may further be cleaned in a chemical bath (e.g., with a permanganate etchant) and/or plated with an electroless or electroless/electrolytic plating process. By forming the cavity 32 about the exposed surfaces 24' of the bonding wires 24, increased surface area is provided for bonding with subsequently deposited materials, (e.g., metal layers of the electromagnetic shield 20 as described below in FIG. 3E). In other embodiments, the cavity 32 may be omitted.

Figure 3E:
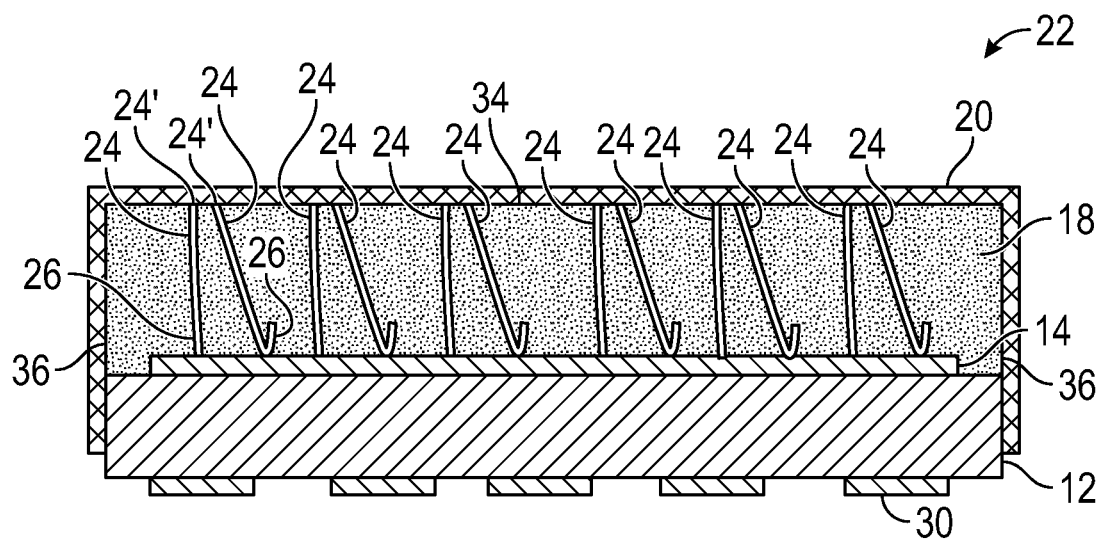
FIG. 3E is a cross-sectional view of the module of FIG. 3C, after an electromagnetic shield has been formed.

FIG. 3E is a cross-sectional view of the module 22 of FIG. 3C, after the electromagnetic shield 20 has been formed. The electromagnetic shield 20 is deposited over the overmold body 18 and may be electrically coupled with the exposed surfaces 24' of the bonding wires 24. In an exemplary aspect, the electromagnetic shield 20 entirely covers a top surface 34 of the overmold body 18 and entirely or almost entirely covers one or more side surfaces 36 of the overmold body 18. As disclosed herein, entirely covering a surface refers to covering at least 99% of the surface, while almost entirely covering a surface refers to covering at least 90% of the surface.

Figure 4:
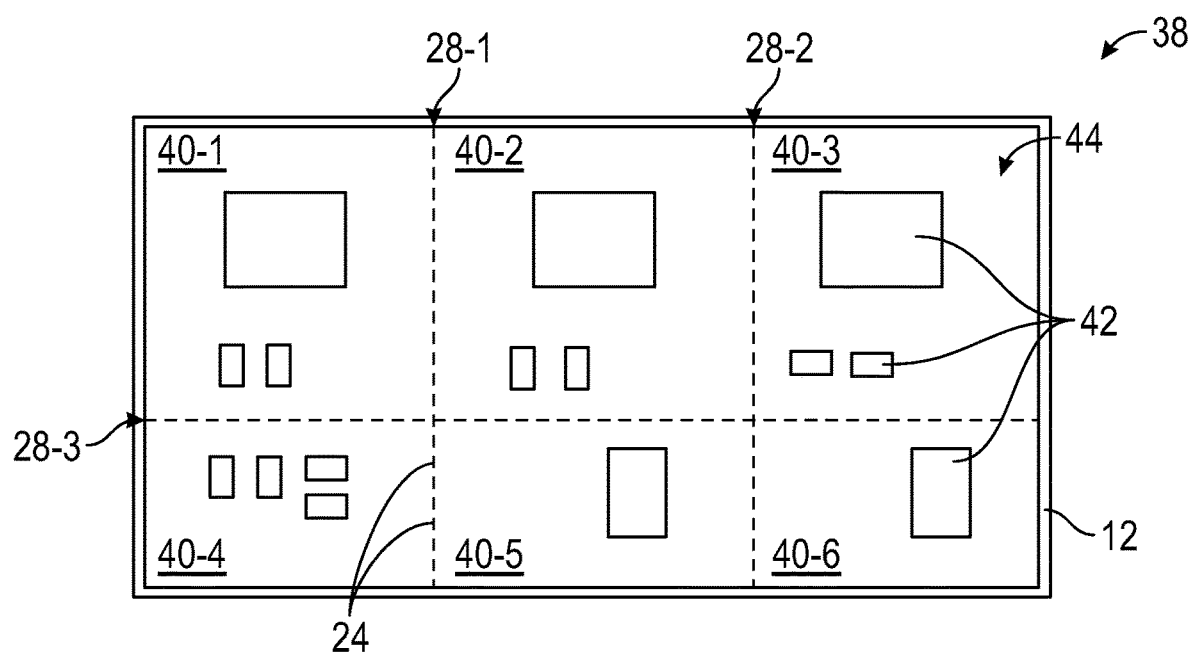
FIG. 4 is a top view of a module that includes a plurality of sub-modules and one or more bonding wire walls according to embodiments disclosed herein.

FIG. 4 is a top view of a module 38 that includes a plurality of sub-modules 40-1 to 40-6 and one or more bonding wire walls 28-1 to 28-3 according to embodiments disclosed herein. Each of the sub-modules 40-1 to 40-6 may include one or more electronic components 42 as described above that are arranged on a mounting surface 44 of the substrate 12. The bonding wire walls 28-1 to 28-3 are arranged between the sub-modules 40-1 to 40-6 to define borders between different ones of the sub-modules 40-1 to 40-6. For example, a first bonding wire wall 28-1 is arranged between a first sub-module 40-1 and a second sub-module 40-2. The first bonding wire wall 28-1 is additionally arranged between a fourth sub-module 40-4 and a fifth sub-module 40-5. As previously described, each of the bonding wire walls 28-1 to 28-3 are formed with a plurality of bonding wires 24. In this manner, at least one bonding wire wall 28-1 to 28-3 is arranged between each of the sub-modules 40-1 to 40-6 to provide reduced EMI between the electronic components 42 in adjacent ones of the sub-modules 40-1 to 40-6.

In certain embodiments, it is to be understood that the electronic components 42 may include one or more integrated circuit die comprised of a semiconducting material such as silicon, gallium arsenide, silicon germanium, or gallium nitride. The electronic components 42 may also include one or more surface mount components that might include capacitive, inductive, and/or resistive element(s). In certain embodiments, the electronic components 42 might include a microelectronics device packaged via techniques such as wafer level fan-out or fan-in methodologies. In other embodiments, one or more of the electronic components 42 may include one or more shielded modules or sub-modules (e.g. the module 10 of FIG. 1B or 2B or the module 22 of FIG. 3E having the electromagnetic shield 20). As such, it is to be further understood, that the electronic components 42 might wholly or in-part include one or more discrete system in package (SIP) devices, including but not limited to a shielded module within a larger shielded module.

Figure 5:
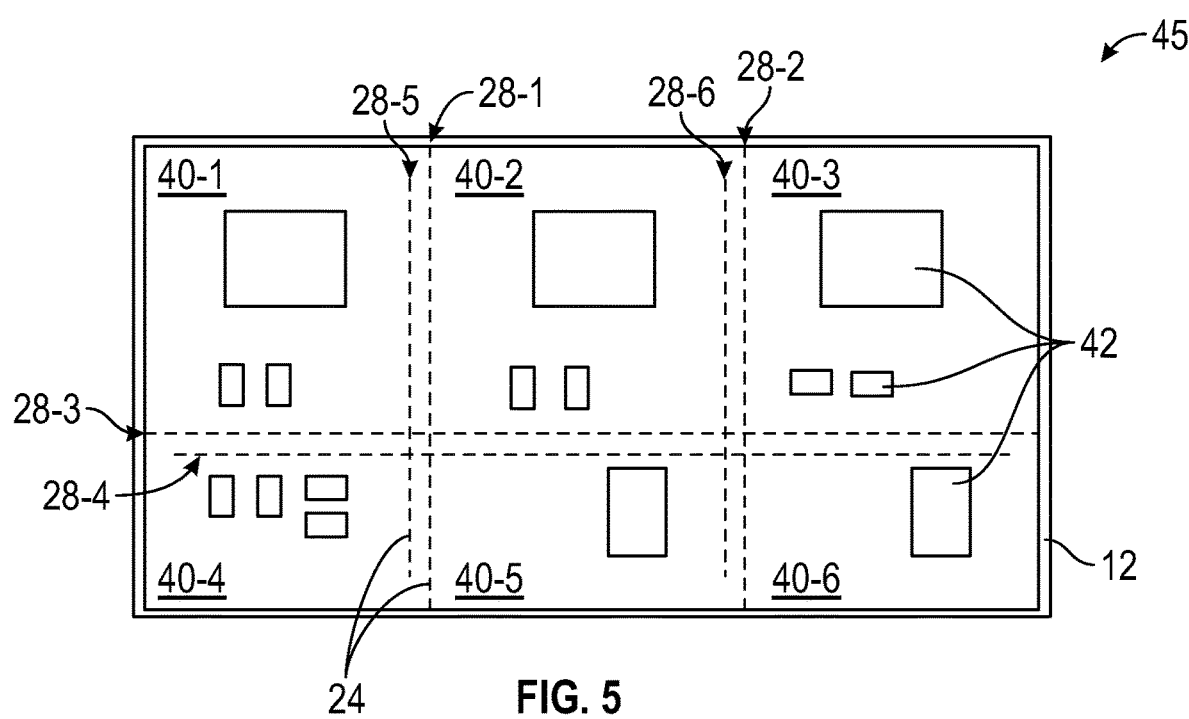
FIG. 5 is a top view of a module that is similar to the module of FIG. 4, but includes a greater number of bonding wire walls according to embodiments disclosed herein.

FIG. 5 is a top view of a module 45 that is similar to the module 38 of FIG. 4, but includes a greater number of bonding wire walls 28-1 to 28-6 according to embodiments disclosed herein. As illustrated, at least two of the bonding wires walls 28-1 to 28-6 are arranged between each of the sub-modules 40-1 to 40-6. For example, the bonding wire walls 28-1, 28-5 are arranged between the sub-modules 40-1, 40-2, and the bonding wire walls 28-2, 28-6 are arranged between the sub-modules 40-2, 40-3, and so on. In this manner, the bonding wire walls 28-1 to 28-6 may be configured to provide even further reduction in EMI between the electronic components 42 in adjacent ones of the sub-modules 40-1 to 40-6. While two rows of bonding wire walls 28-1 to 28-6 are illustrated in FIG. 5, it is understood that higher numbers of bonding wire walls 28-1 to 28-6 may be provided between adjacent ones of the sub-modules 40-1 to 40-6. For example, three bonding wire walls, or four bonding wire walls or more may be arranged adjacent ones of the sub-modules 40-1 to 40-6. In FIG. 5, adjacent rows of bonding wire walls 28-1 to 28-6 are arranged in generally parallel alignment between adjacent ones of the sub-modules 40-1 to 40-6, and the adjacent rows of bonding wire walls 28-1 to 28-6 intersect with other rows of the bonding wire walls 28-1 to 28-6 at various corners of the sub-modules 40-1 to 40-6. Other arrangements of bonding wire walls 28-1 to 28-6 are possible without departing from the principles of the present disclosure. For example, the bonding wire walls 28-1 to 28-6 may be provided in non-linear arrangements across the substrate 12, thereby forming non-linear boundaries of the sub-modules 40-1 to 40-6. In certain embodiments, each of the bonding wire walls 28-1 to 28-6 may from one or more curved walls around various ones of the sub-modules 40-1 to 40-6. In certain embodiments, the bonding wires 24 of the bonding wire wall 28-1 may be arranged in a staggered alignment with the bonding wires 24 of the adjacent bonding wire wall 28-5. In this manner, any gaps between individual bonding wires 24 of one bonding wire wall 28-1 may be at least partially aligned with a bonding wire 24 of the adjacent bonding wire wall 28-5, thereby providing improved reduction in EMI between adjacent sub-modules 40-1, 40-2.

Figure 6:
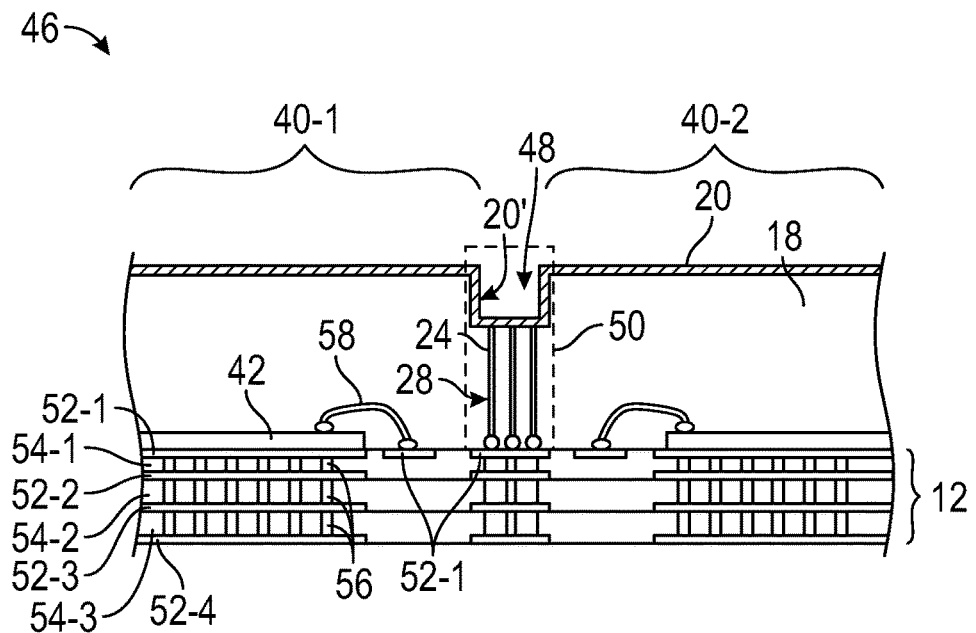
FIG. 6 is a cross-sectional view of a representative module that includes one or more bonding wire walls according to embodiments disclosed herein.

FIG. 6 is a cross-sectional view of a representative module 46 that includes one or more bonding wire walls 28 according to embodiments disclosed herein. As illustrated, the module 46 includes the first sub-module 40-1 and the second sub-module 40-2, although other numbers of sub-modules are possible without deviating from the principles of the present disclosure. As previously described, the first and second sub-modules 40-1, 40-2 may each comprise one or more electronic components 42 mounted on the substrate 12 that are within the overmold body 18. The module 46 further includes the electromagnetic shield 20 that is conformal over each of the sub-modules 40-1, 40-2. In particular, the electromagnetic shield 20 conformally covers the overmold body 18 and an opening 48 that is formed between the sub-modules 40-1, 40-2. In certain embodiments, the opening 48 is formed when a removal process is selectively applied to an area of the overmold body 18 that is registered between the sub-modules 40-1, 40-2. The removal process may include any of the processes as previously described for FIG. 3C to expose surfaces of the bonding wires 24 that are arranged between the sub-modules 40-1, 40-2. Notably, the opening 48 does not extend entirely through the overmold body 18 such that the overmold body 18 is continuous across the first and second sub-modules 40-1, 40-2. Additionally, portions of the bonding wires 24 of the bonding wire walls 28 are embedded in the overmold body 18. In certain embodiments, a width of the opening 48 measured as a distance from the first sub-module 40-1 to the second sub-module 40-2 may include a range from about 0.1 millimeters (mm) to about 3 mm, depending on the application and the removal process used to fabricate the opening 48. For example, sawing with a saw blade of a particular width may provide an opening 48 with a width that is at least equal to the width of the saw blade. As the electromagnetic shield 20 may be conformal to the opening, one or more portions 20' of the electromagnetic shield 20 extend toward the substrate 12 between the first and second sub-modules 40-1, 40-2, thereby forming one or more sidewalls of the electromagnetic shield 20 that are registered with the opening 48. In the cross-sectional view of FIG. 6, three bonding wires 24 are illustrated, which may represent portions of three different bonding wire walls 28 that are arranged adjacent to one another between the sub-modules 40-1, 40-2. As previously described, any number of bonding wires walls 28 may be arranged between the sub-modules 40-1, 40-2. The electromagnetic shield 20 may therefore be electrically coupled to the bonding wires 24 of the bonding wire walls 28 and electrically grounded by the substrate 12 as further described below. In this manner, the one or more bonding wire walls 28 and the one or more portions 20' of the electromagnetic shield 20 that extend toward the substrate 12 collectively form a divider wall 50 as indicated by the dashed box in FIG. 6. The divider wall 50 is thus configured to reduce EMI between the sub-modules 40-1, 40-2.

The substrate 12 may comprise a laminate structure that includes one or more metal layers 52-1 to 52-4 and one or more dielectric layers 54-1 to 54-3. One or more vias 56 may also be provided to provide electrical connections between different ones of the metal layers 52-1 to 52-4. In this regard, the substrate 12 may comprise a printed circuit board where the one or more metal layers 52-1 to 52-4 are laminated in an alternating configuration with the one or more dielectric layers 54-1 to 54-3. While four metal layers 52-1 to 52-4 are illustrated, the substrate 12 may be configured with any number of metal layers. Generally, increasing the number of laminated metal layers corresponds to an increased number of electronic components that may be mounted and electrically connected on a particular laminate structure. This allows electrical connections to various electronic components 42 to be made at different horizontal planes within the substrate 12. In certain embodiments, the one or more metal layers 52-1 to 52-4 may include Cu, Cu foil, or the like while the one or more dielectric layers 54-1 to 54-3 may include fiber materials, glass, epoxy, glass-reinforced epoxy, ceramic materials, polymer materials and combinations thereof. Each of the metal layers 52-1 to 52-4 may comprise a pattern of continuous portions and discontinuous portions along the substrate 12. Discontinuous portions of the same metal layer (e.g., 52-1) may be electrically isolated from one another. As illustrated, an electronic component 42 is mounted to a certain portion of a first metal layer 52-1 and then a wire bond connection 58 is provided to electrically connect the electronic component 42 to a different portion of the first metal layer 52-1. Additionally, the bonding wires 24 of the bonding wire walls 28 are electrically coupled to yet another portion of the first metal layer 52-1 that is electrically coupled to ground. In this manner, the electronic component 42 may be electrically activated by portions of the first metal layer 52-1 while the electromagnetic shield 20 and the bonding wire walls 28 are electrically grounded by a different portion of the first metal layer 52-1. The presence of one or more wire-bond connections 58 for the electronic components 42 can act as miniature antennas that facilitate undesirable leakage or interference of electromagnetic signals from the first sub-module 40-1 to the second sub-module 40-2. Accordingly, the divider wall 50 is arranged to reduce such interference. In other embodiments, one or more of the electronic components 42 may be flip-chip mounted on the substrate 12.

Figure 7:
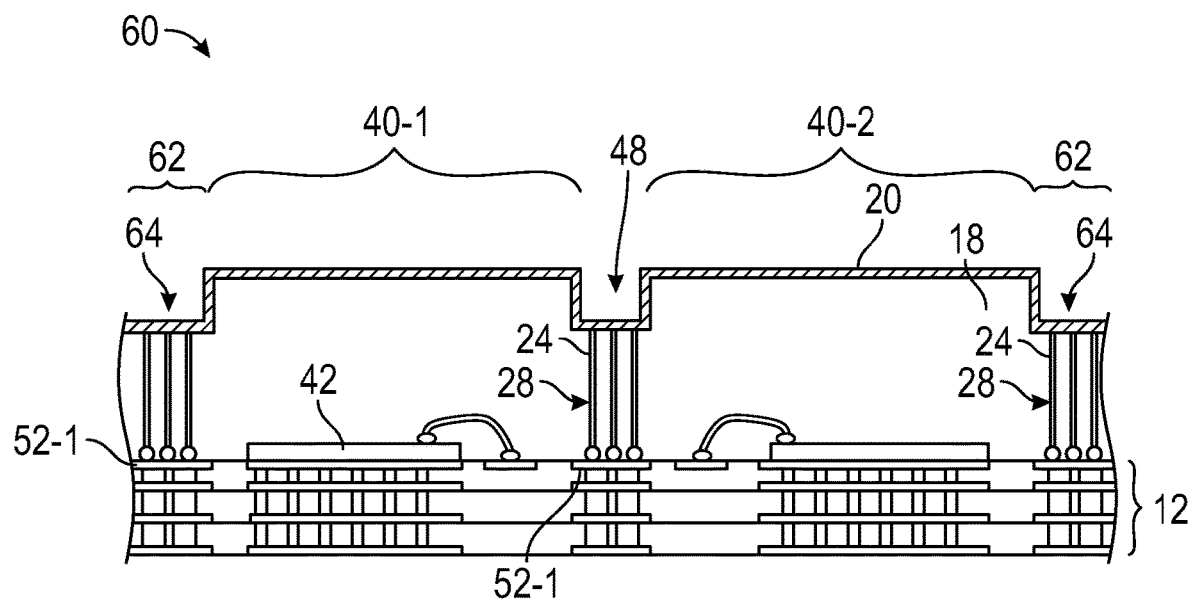
FIG. 7 is a cross-sectional view of a representative module that is similar to the module of FIG. 6 and further includes one or more bonding wire walls arranged along one or more peripheral boundaries of the module.

FIG. 7 is a cross-sectional view of a representative module 60 that is similar to the module 46 of FIG. 6 and further includes one or more bonding wire walls 28 arranged along one or more peripheral boundaries 62 of the module 60. As illustrated, the peripheral boundaries 62 of the module 60 are bounded by perimeters of the first and second sub-modules 40-1 to 40-2. In certain embodiments, one or more bonding wire walls 28 are provided between the first and second sub-modules 40-1 to 40-2 as described for FIG. 6, and one or more additional bonding wire walls 28 are arranged about the one or more peripheral boundaries 62. As with previous embodiments, each of the bonding wire walls 28 may be formed by a plurality of the bonding wires 24. As illustrated, the bonding wire walls 28 arranged about the peripheral boundaries 62 may be electrically coupled to ground by portions of the first metal layer 52-1 of the substrate 12. In this manner, the electromagnetic shield 20 is arranged on the first sub-module 40-1 and the second sub-module 40-2, and the electromagnetic shield 20 is electrically coupled and grounded to the bonding wire walls 28 arranged between the sub-modules 40-1, 40-2 and along the peripheral boundaries 62. In certain embodiments, one or more additional openings 64 may be formed in the overmold body 18 along the peripheral boundaries 62 in a similar manner to the opening 48 that is formed between the sub-modules 40-1, 40-2. As such, portions of the electromagnetic shield 20 may also be configured to extend toward the substrate 12 along the peripheral boundaries 62. In other embodiments, the additional openings 64 may be omitted.

Figure 8A:
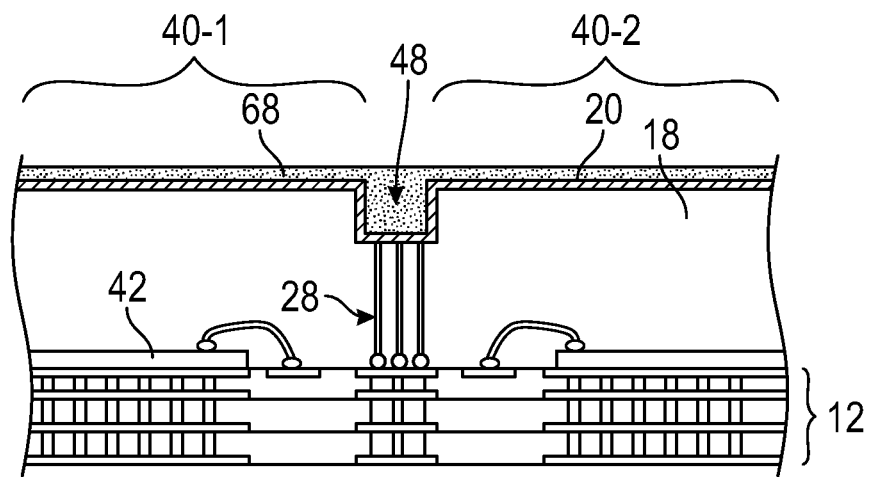
FIG. 8A and FIG. 8B are cross-sectional views of a module where a fill material is applied in an opening that is formed between sub-modules according to embodiments disclosed herein.
Figure 8B:
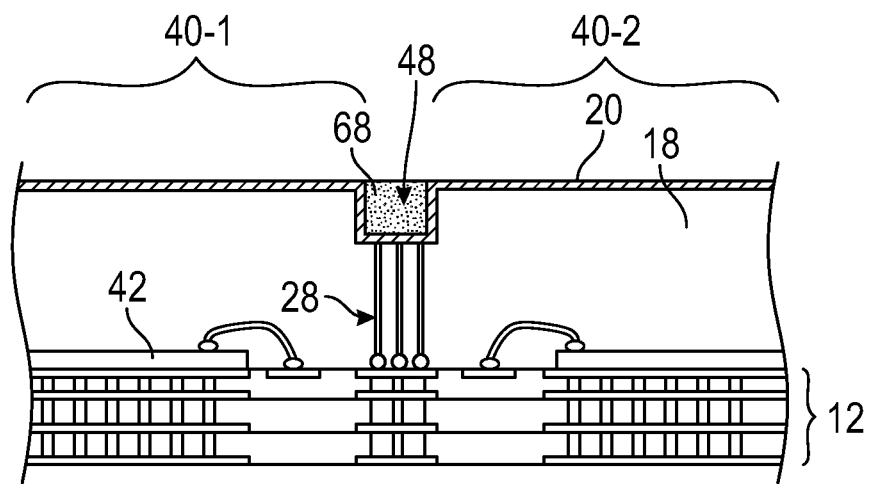

FIG. 8A and FIG. 8B are a cross-sectional views of a module 66 where a fill material 68 is applied in the opening 48 that is formed between the sub-modules 40-1, 40-2 according to embodiments disclosed herein. The module 60 includes the first sub-module 40-1 and the second sub-module 40-2 on the substrate 12, the electromagnetic shield 20, and one or more of the bonding wire walls 28 as previously described. Each of the sub-modules 40-1, 40-2 may include one or more of the electronic components 42 that are mounted to the substrate 12. In certain embodiments, the fill material 68 may be arranged in the opening 48 between each sub-module 40-1, 40-2 to provide structural support. In this manner, the fill material 68 may be arranged on the portion of the electromagnetic shield 20 that is in the opening 48. In certain embodiments, the fill material 68 is configured to partially, but not fully fill the opening 48 and in other embodiments, the fill material 68 may completely fill the opening 48. The fill material 68 may comprise one or more of an epoxy, a mold compound, and a thermoset material, among others. In certain embodiments, the fill material 68 comprises one or more insulating or dielectric materials. In certain embodiments, the fill material 68 may comprise the same material as the overmold body 18. The fill material 68 may be formed by dispensing, molding, transfer molding, or compression molding techniques, among others. In other embodiments, the fill material 68 may comprise a conductive material, such as conductive epoxy, or one or more metallized layers (not shown) formed by various plating or deposition techniques. As illustrated in FIG. 8A, the fill material 68 may also be arranged on or to cover portions of the electromagnetic shield 20 that are outside of the opening 48, thereby providing additional encapsulation. In other embodiments, the fill material 68 may only be arranged within the opening 48 as illustrated in FIG. 8B.

Figure 9:
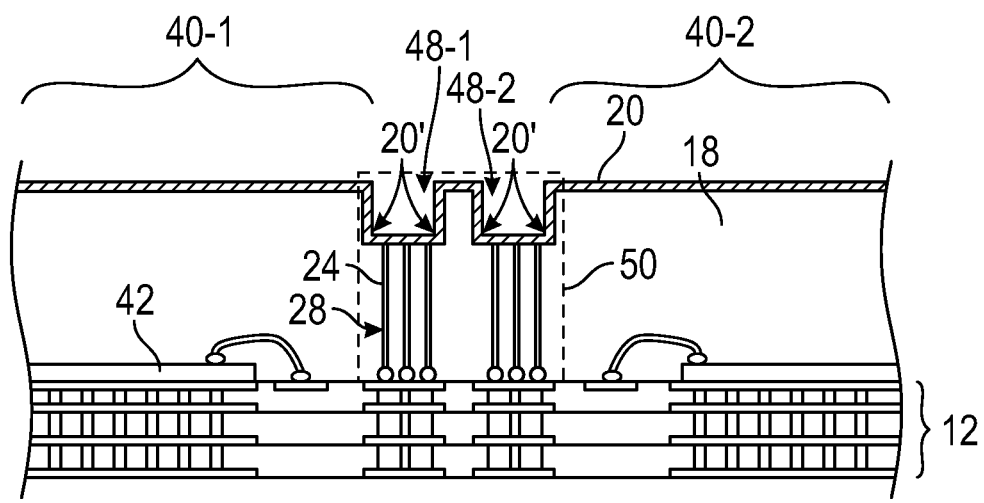
FIG. 9 is a cross-sectional view of a module that includes a plurality of the openings that are formed between sub-modules according to embodiments disclosed herein.

FIG. 9 is a cross-sectional view of a module 70 that includes a plurality of openings 48-1 to 48-2 that are formed between the sub-modules 40-1, 40-2 according to embodiments disclosed herein. The module 70 includes the first sub-module 40-1 and the second sub-module 40-2 on the substrate 12, the electromagnetic shield 20, and one or more of the bonding wire walls 28 formed of bonding wires 24 as previously described. Each of the sub-modules 40-1, 40-2 may include one or more of the electronic components 42 that are mounted to the substrate 12. As illustrated, the plurality of openings 48-1 to 48-2 are formed in the overmold body 18 and arranged between the sub-modules 40-1, 40-2. In this manner, the electromagnetic shield 20 is conformal to each of the plurality of openings 48-1 to 48-2, thereby forming a plurality of portions 20' that extend toward the substrate 12. In this manner, the divider wall 50 is arranged with increased surface area of the electromagnetic shield 20 for reducing EMI. As illustrated, the divider wall 50 may additionally include one or more of the bonding wire walls 28 that are registered with each of the openings 48-1 to 48-2. In certain embodiments, one or more of the openings 48-1 to 48-2 may include the fill material (68 of FIG. 8A) as previously described. While two openings 48-1 to 48-2 are illustrated in FIG. 9, any number of openings between the sub-modules 40-1, 40-2 may be provided without departing from the principles of the present disclosure.

Figure 10:
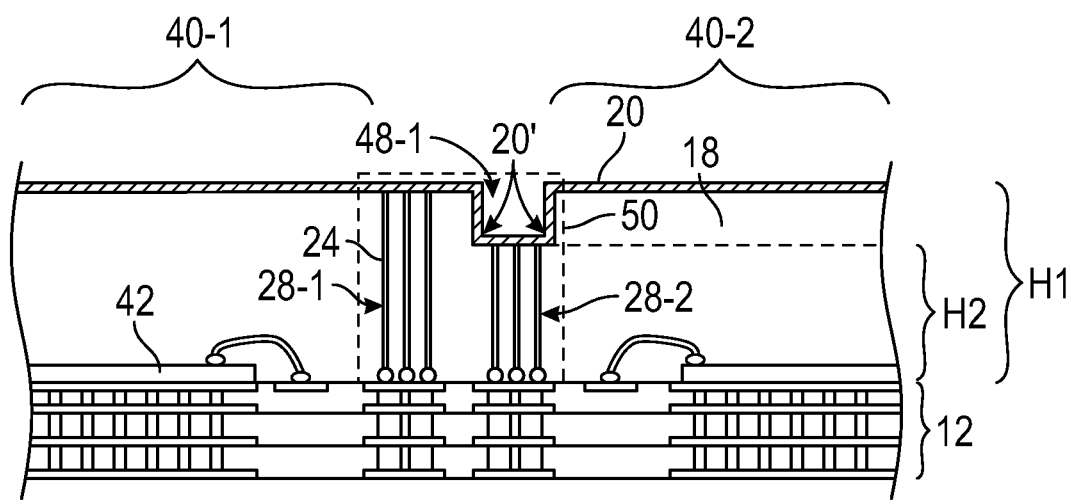
FIG. 10 is a cross-sectional view of a module that includes bond wire walls that have differing heights according to embodiments disclosed herein.

FIG. 10 is a cross-sectional view of a module 72 that includes a plurality of bonding wire walls 28-1 to 28-2 that have differing heights according to embodiments disclosed herein. The module 72 includes the first sub-module 40-1 and the second sub-module 40-2 on the substrate 12, the electromagnetic shield 20, and the plurality of the bonding wire walls 28-1 to 28-2 formed of bonding wires 24 as previously described. Each of the sub-modules 40-1, 40-2 may include one or more of the electronic components 42 that are mounted to the substrate 12. As illustrated, the divider wall 50 includes the bonding wire wall 28-1 that forms a first height H1 above the substrate 12 and the bonding wire wall 28-2 that forms a second height H2 above the substrate 12, wherein the second height H2 is less than or greater than the first height H1. In certain embodiments, the opening 48-1 in the overmold body 18 is only registered with the bonding wire wall 28-2, thereby forming the second height H2 as less than the first height H1. Other arrangements are possible without departing from the principles of the present disclosure. For example, the bonding wire walls 28-1, 28-2 of differing heights may be arranged at different locations of the module 72. In certain embodiments, bonding wire walls 28 arranged along one or more peripheral boundaries (e.g., 62 of FIG. 7) of the module 72 may form heights that are greater than or less than heights of the bonding wire walls 28 that are registered between the sub-modules 40-1, 40-2. In certain embodiments, the differing heights H1, H2 may be formed by sequential removal processes applied to the overmold body 18. For example, a first removal process may be applied to portions of the overmold body 18 over each of the sub-modules 40-1, 40-2 to expose at least a portion of the bonding wire wall 28-1. A second removal process may then be selectively applied to a portion of the overmold body 18 that is registered with the bonding wire wall 28-2, thereby exposing a portion of the bonding wire wall 28-2.

Figure 11:
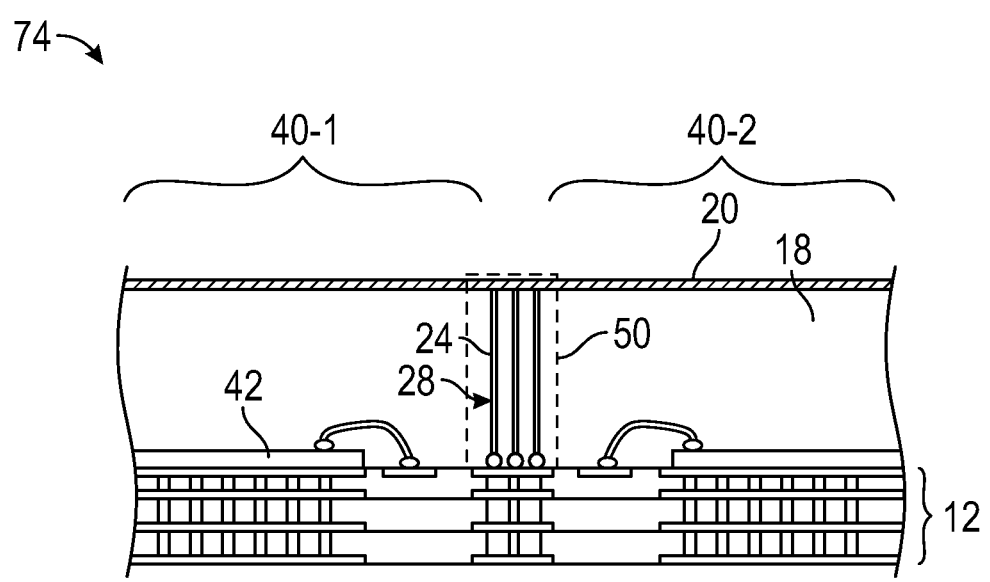
FIG. 11 is a cross-sectional view of a module that is devoid of openings in an overmold body between sub-modules according to embodiments disclosed herein.

FIG. 11 is a cross-sectional view of a module 74 that is devoid of openings in the overmold body 18 between the sub-modules 40-1, 40-2 according to embodiments disclosed herein. The module 74 includes the first sub-module 40-1 and the second sub-module 40-2 on the substrate 12, the electromagnetic shield 20, and one or more of the bonding wire walls 28 as previously described. Each of the sub-modules 40-1, 40-2 may include one or more of the electronic components 42 that are mounted to the substrate 12. As illustrated, the overmold body 18 is devoid of openings (48 of FIG. 7) that are arranged between the sub-modules 40-1, 40-2. In this manner, the removal process that exposes portions of the bond wires 24 of the bonding wire walls 28 may be applied across the module 74 such that portions of the overmold body 18 are removed across each of the sub-modules 40-1, 40-2. As illustrated, the divider wall 50 may include a plurality of the bonding wire walls 28 that are electrically coupled to the electromagnetic shield 20.

Those skilled in the art will recognize improvements and modifications to the preferred embodiments of the present disclosure. All such improvements and modifications are considered within the scope of the concepts disclosed herein and the claims that follow.

What is claimed is:

1. An electronic module comprising:
   a substrate;
   a first sub-module and a second sub-module arranged on a mounting surface of the substrate;
   a first plurality of bonding wires on the substrate that form a first bonding wire wall arranged between the first sub-module and the second sub-module, wherein individual bonding wires of the first plurality of bonding wires are discrete elements that are laterally separated from one another on the substrate;
   an electromagnetic shield arranged on the first sub-module and the second sub-module, wherein a portion of the electromagnetic shield extends toward the substrate between the first sub-module and the second sub-module; and
   an overmold body on the substrate, wherein the overmold body is arranged between the individual bonding wires of the first plurality of bonding wires;
   wherein the first bonding wire wall and the portion of the electromagnetic shield that extend towards the substrate between the first sub-module and the second sub-module form a divider wall that reduces electromagnetic interference between the first sub-module and the second sub-module.

2. The electronic module of claim 1, further comprising a second bonding wire wall that is arranged between the first sub-module and the second sub-module and adjacent to the first bonding wire wall, the second bonding wire wall formed from a second plurality of bonding wires.

3. The electronic module of claim 2, wherein the first bonding wire wall is arranged with a parallel alignment to the second bonding wire wall.

4. The electronic module of claim 2, wherein the first plurality of bonding wires of the first bonding wire wall are arranged with a staggered alignment to the second plurality of bonding wires of the second bonding wire wall.

5. The electronic module of claim 2, wherein the first bonding wire wall is arranged with a non-linear alignment to the second bonding wire wall.

6. The electronic module of claim 1, wherein the electromagnetic shield is electrically coupled to ground by way of the first bonding wire wall.

7. The electronic module of claim 1, wherein the overmold body is continuous across the first sub-module and the second sub-module.

8. The electronic module of claim 7, wherein the first bonding wire wall is at least partially embedded in the overmold body.

9. The electronic module of claim 7, wherein the portion of the electromagnetic shield that extends towards the substrate is arranged in an opening formed in the overmold body.

10. The electronic module of claim 9, further comprising a fill material arranged in the opening.

11. The electronic module of claim 7, wherein the portion of the electromagnetic shield that extends toward the substrate is arranged in a plurality of openings formed in the overmold body.

12. An electronic module comprising:
    a substrate;
    a first sub-module and a second sub-module arranged on a mounting surface of the substrate;
    a first plurality of bonding wires on the substrate, wherein individual bonding wires of the first plurality of bonding wires are discrete elements that are laterally separated from one another on the substrate and form a first bonding wire wall arranged between the first sub-module and the second sub-module;
    a second plurality of bonding wires on the substrate, wherein individual bonding wires of the second plurality of bonding wires are discrete elements that are laterally separated from one another on the substrate and form a second bonding wire wall arranged about a peripheral boundary of the module;
    an electromagnetic shield arranged on the first sub-module and the second sub-module, wherein the electromagnetic shield is electrically coupled to the first bonding wire wall and the second bonding wire wall, and wherein the second bonding wire wall is electrically connected to the electromagnetic shield at a portion of the electromagnetic shield that extends toward the substrate at the peripheral boundary of the module; and
    an overmold body on the substrate, wherein the overmold body is arranged between the individual bonding wires of the first plurality of bonding wires and between the individual bonding wires of the second plurality of bonding wires.

13. The electronic module of claim 12, wherein the overmold body is continuous across the first sub-module and the second sub-module.

14. The electronic module of claim 13, wherein the first bonding wire wall is at least partially embedded in the overmold body.

15. The electronic module of claim 13, wherein the portion of the electromagnetic shield that extends towards the substrate is arranged in an opening formed in the overmold body.

16. The electronic module of claim 12, wherein a height of the first bonding wire wall above the substrate is different than a height of the second bonding wire wall above the substrate.

17. The electronic module of claim 12, wherein the electromagnetic shield is electrically coupled to ground by way of the first bonding wire wall and the second bonding wire wall.

18. An electronic module comprising:
a substrate;
a first sub-module and a second sub-module arranged on a mounting surface of the substrate;
a first plurality of bonding wires on the substrate, wherein individual bonding wires of the first plurality of bonding wires are discrete elements that are laterally separated from one another on the substrate and form a first bonding wire wall, the first bonding wire wall forming a first height above the substrate;
a second plurality of bonding wires on the substrate, wherein individual bonding wires of the second plurality of bonding wires are discrete elements that are laterally separated from one another on the substrate and form a second bonding wire wall, the second bonding wire wall forming a second height above the substrate that is less than the first height;
an electromagnetic shield arranged on the first sub-module and the second sub-module, wherein the electromagnetic shield is electrically coupled to the first bonding wire wall and the second bonding wire wall; and
an overmold body on the substrate, wherein the overmold body is arranged between the individual bonding wires of the first plurality of bonding wires and between the individual bonding wires of the second plurality of bonding wires.

19. The electronic module of claim 18, wherein the first bonding wire wall and the second bonding wire wall are arranged between the first sub-module and the second sub-module.

20. The electronic module of claim 18, wherein the first bonding wire wall is arranged between the first sub-module and the second sub-module, and the second bonding wire wall is arranged about a peripheral boundary of the module.

21. The electronic module of claim 18, wherein the second bonding wire wall is arranged between the first sub-module and the second sub-module, and the first bonding wire wall is arranged about a peripheral boundary of the module.

22. The electronic module of claim 18, wherein the electromagnetic shield is electrically coupled to ground by way of the first bonding wire wall and the second bonding wire wall.

* * * * *